(12) United States Patent
Tang et al.

(10) Patent No.: US 9,252,188 B2
(45) Date of Patent: Feb. 2, 2016

(54) METHODS OF FORMING MEMORY CELLS

(75) Inventors: Sanh D. Tang, Boise, ID (US); Scott E. Sills, Boise, ID (US); John K. Zahurak, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 301 days.

(21) Appl. No.: 13/298,840

(22) Filed: Nov. 17, 2011

(65) Prior Publication Data

US 2013/0126816 A1 May 23, 2013

(51) Int. Cl.
*H01L 45/00* (2006.01)
*H01L 27/24* (2006.01)

(52) U.S. Cl.
CPC ........ *H01L 27/2409* (2013.01); *H01L 27/2463* (2013.01); *H01L 45/085* (2013.01); *H01L 45/1233* (2013.01); *H01L 45/16* (2013.01); *H01L 45/1675* (2013.01)

(58) Field of Classification Search
CPC ............ H01L 27/2463; H01L 27/2409; H01L 45/085; H01L 45/16; H01L 45/1675; H01L 45/1233
USPC ................. 438/128, 129, 131, 132, 381, 382; 257/2, 74, 278, E27.026, E21.613, 257/E21.614
See application file for complete search history.

(56) References Cited

U.S. PATENT DOCUMENTS

| | | | |
|---|---|---|---|
| 4,752,118 A | 6/1988 | Johnson | |
| 4,849,247 A | 7/1989 | Scanlon et al. | |
| 4,987,099 A | 1/1991 | Flanner | |
| 5,055,423 A | 10/1991 | Smith et al. | |
| 5,166,758 A | 11/1992 | Ovshinsky et al. | |
| 5,341,328 A | 8/1994 | Ovshinsky et al. | |
| 5,895,963 A | 4/1999 | Yamazaki | |
| 5,912,839 A | 6/1999 | Ovshinsky et al. | |

(Continued)

FOREIGN PATENT DOCUMENTS

| WO | WO 2005/041196 | 5/2005 |
|---|---|---|
| WO | WO 2010/073904 | 7/2010 |

(Continued)

OTHER PUBLICATIONS

Happ et al., "Novel One-Mask Self-Heating Pillar Phase Chaneg Memory", IEEE, 2006 Symposium on VLSI Technology Digest of Technical Papers.

(Continued)

*Primary Examiner* — Latanya N Crawford
(74) *Attorney, Agent, or Firm* — Wells St. John P.S.

(57) ABSTRACT

Some embodiments include methods of forming memory cells. A series of rails is formed to include bottom electrode contact material. Sacrificial material is patterned into a series of lines that cross the series of rails. A pattern of the series of lines is transferred into the bottom electrode contact material. At least a portion of the sacrificial material is subsequently replaced with top electrode material. Some embodiments include memory arrays that contain a second series of electrically conductive lines crossing a first series of electrically conductive lines. Memory cells are at locations where the electrically conductive lines of the second series overlap the electrically conductive lines of the first series. First and second memory cell materials are within the memory cell locations. The first memory cell material is configured as planar sheets and the second memory cell material is configured as upwardly-opening containers.

14 Claims, 12 Drawing Sheets

(56) References Cited

U.S. PATENT DOCUMENTS

| | | | |
|---|---|---|---|
| 6,143,670 A | 11/2000 | Cheng et al. |
| 6,611,453 B2 | 8/2003 | Ning |
| 6,613,604 B2 | 9/2003 | Maimon et al. |
| 6,661,330 B1 | 12/2003 | Young |
| 6,664,182 B2 | 12/2003 | Jeng |
| 6,692,898 B2 | 2/2004 | Ning |
| 6,700,211 B2 | 3/2004 | Gonzalez |
| 6,764,894 B2 | 7/2004 | Lowrey |
| 6,815,704 B1 | 11/2004 | Chen |
| 7,148,140 B2 | 12/2006 | Leavy et al. |
| 7,169,624 B2 | 1/2007 | Hsu |
| 7,332,401 B2 | 2/2008 | Moore et al. |
| 7,422,926 B2 | 9/2008 | Pellizzer et al. |
| 7,453,111 B2 | 11/2008 | Ryoo et al. |
| 7,619,933 B2 | 11/2009 | Sarin |
| 7,638,787 B2 | 12/2009 | An et al. |
| 7,646,631 B2 | 1/2010 | Lung |
| 7,719,039 B2 | 5/2010 | Muralidhar et al. |
| 7,772,680 B2 | 8/2010 | Manning |
| 7,773,413 B2 | 8/2010 | Shalvi |
| 7,785,978 B2 | 8/2010 | Smythe |
| 7,800,092 B2 | 9/2010 | Liu et al. |
| 7,803,655 B2 | 9/2010 | Johnson et al. |
| 7,838,341 B2 | 11/2010 | Dennison |
| 7,867,832 B2 | 1/2011 | Yang et al. |
| 7,888,711 B2 | 2/2011 | Cheung et al. |
| 7,915,602 B2 | 3/2011 | Sato |
| 7,919,766 B2 | 4/2011 | Lung |
| 7,935,553 B2 | 5/2011 | Scheuerlein et al. |
| 7,974,115 B2 | 7/2011 | Jeong et al. |
| 8,013,319 B2 | 9/2011 | Chang |
| 8,110,822 B2 | 2/2012 | Chen |
| 8,486,743 B2 | 7/2013 | Bresolin et al. |
| 8,507,353 B2 | 8/2013 | Oh et al. |
| 8,546,231 B2 | 10/2013 | Pellizzer et al. |
| 8,614,433 B2 | 12/2013 | Lee et al. |
| 8,723,155 B2 | 5/2014 | Redaelli et al. |
| 8,765,555 B2 | 7/2014 | Van Gerpen |
| 8,822,969 B2 | 9/2014 | Hwang |
| 2002/0017701 A1 | 2/2002 | Klersy et al. |
| 2002/0173101 A1 | 11/2002 | Shau |
| 2002/0177292 A1 | 11/2002 | Dennison |
| 2004/0178425 A1 | 9/2004 | Kato |
| 2004/0188668 A1 | 9/2004 | Hamann et al. |
| 2005/0006681 A1 | 1/2005 | Okuno |
| 2005/0110983 A1 | 5/2005 | Jeong et al. |
| 2005/0117397 A1 | 6/2005 | Morimoto |
| 2006/0073652 A1 | 4/2006 | Pellizzer et al. |
| 2006/0076548 A1 | 4/2006 | Park et al. |
| 2006/0113520 A1 | 6/2006 | Yamamoto et al. |
| 2006/0157682 A1 | 7/2006 | Scheuerlein |
| 2006/0186440 A1 | 8/2006 | Wang et al. |
| 2006/0284279 A1 | 12/2006 | Lung et al. |
| 2006/0286709 A1 | 12/2006 | Lung et al. |
| 2007/0012905 A1 | 1/2007 | Huang |
| 2007/0029676 A1 | 2/2007 | Takaura et al. |
| 2007/0054486 A1 | 3/2007 | Yang |
| 2007/0075347 A1 | 4/2007 | Lai et al. |
| 2007/0075359 A1 | 4/2007 | Yoon et al. |
| 2007/0108431 A1 | 5/2007 | Chen et al. |
| 2007/0158698 A1 | 7/2007 | Dennison et al. |
| 2007/0224726 A1 | 9/2007 | Chen et al. |
| 2007/0235708 A1 | 10/2007 | Elmegreen et al. |
| 2007/0279974 A1 | 12/2007 | Dennison et al. |
| 2008/0043520 A1 | 2/2008 | Chen |
| 2008/0054470 A1 | 3/2008 | Amano et al. |
| 2008/0067485 A1 | 3/2008 | Besana et al. |
| 2008/0067486 A1 | 3/2008 | Karpov et al. |
| 2008/0093703 A1 | 4/2008 | Yang et al. |
| 2008/0101109 A1 | 5/2008 | Haring-Bolivar et al. |
| 2008/0105862 A1 | 5/2008 | Lung et al. |
| 2008/0128677 A1 | 6/2008 | Park et al. |
| 2008/0137400 A1 | 6/2008 | Chen et al. |
| 2008/0138929 A1 | 6/2008 | Lung |
| 2008/0157053 A1 | 7/2008 | Lai et al. |
| 2008/0197394 A1* | 8/2008 | Caspary et al. ............... 257/300 |
| 2009/0008621 A1 | 1/2009 | Lin et al. |
| 2009/0017577 A1 | 1/2009 | An et al. |
| 2009/0032794 A1 | 2/2009 | Hsiao |
| 2009/0039333 A1 | 2/2009 | Chang et al. |
| 2009/0072213 A1 | 3/2009 | Elmegreen et al. |
| 2009/0072341 A1 | 3/2009 | Liu et al. |
| 2009/0091971 A1 | 4/2009 | Dennison et al. |
| 2009/0101883 A1 | 4/2009 | Lai et al. |
| 2009/0108247 A1 | 4/2009 | Takaura et al. |
| 2009/0115020 A1 | 5/2009 | Yang et al. |
| 2009/0127538 A1* | 5/2009 | Ryoo et al. ..................... 257/5 |
| 2009/0147564 A1 | 6/2009 | Lung |
| 2009/0166601 A1 | 7/2009 | Czubatyj et al. |
| 2009/0194757 A1 | 8/2009 | Lam et al. |
| 2009/0194758 A1 | 8/2009 | Chen |
| 2009/0230505 A1* | 9/2009 | Dennison ..................... 257/522 |
| 2009/0298222 A1 | 12/2009 | Lowrey et al. |
| 2009/0302300 A1 | 12/2009 | Chang et al. |
| 2009/0321706 A1 | 12/2009 | Happ et al. |
| 2010/0001248 A1 | 1/2010 | Wouters et al. |
| 2010/0001253 A1 | 1/2010 | Arnold et al. |
| 2010/0019221 A1* | 1/2010 | Lung et al. .................... 257/5 |
| 2010/0054029 A1 | 3/2010 | Happ et al. |
| 2010/0055830 A1 | 3/2010 | Chen et al. |
| 2010/0065530 A1 | 3/2010 | Walker et al. |
| 2010/0072447 A1 | 3/2010 | Lung |
| 2010/0072453 A1 | 3/2010 | Jeong et al. |
| 2010/0107403 A1 | 5/2010 | Aubel et al. |
| 2010/0151652 A1 | 6/2010 | Lung et al. |
| 2010/0163830 A1 | 7/2010 | Chang et al. |
| 2010/0163833 A1 | 7/2010 | Borghi et al. |
| 2010/0165719 A1 | 7/2010 | Pellizzer |
| 2010/0176368 A1* | 7/2010 | Ko et al. ........................ 257/5 |
| 2010/0176911 A1 | 7/2010 | Park et al. |
| 2010/0207168 A1* | 8/2010 | Sills et al. ..................... 257/202 |
| 2010/0213431 A1 | 8/2010 | Yeh et al. |
| 2010/0221874 A1 | 9/2010 | Kuo et al. |
| 2010/0270529 A1 | 10/2010 | Lung |
| 2010/0301303 A1 | 12/2010 | Wang et al. |
| 2010/0301304 A1 | 12/2010 | Chen et al. |
| 2010/0301417 A1 | 12/2010 | Cheng et al. |
| 2010/0308296 A1 | 12/2010 | Pirovano et al. |
| 2010/0323490 A1 | 12/2010 | Sreenivasan et al. |
| 2010/0327251 A1 | 12/2010 | Park |
| 2011/0001114 A1 | 1/2011 | Zanderighi et al. |
| 2011/0031461 A1 | 2/2011 | Kang et al. |
| 2011/0074538 A1 | 3/2011 | Wu et al. |
| 2011/0092041 A1 | 4/2011 | Lai et al. |
| 2011/0155984 A1 | 6/2011 | Redaelli et al. |
| 2011/0193049 A1 | 8/2011 | Iwakaji et al. |
| 2011/0215436 A1* | 9/2011 | Tang et al. ..................... 257/506 |
| 2011/0284815 A1 | 11/2011 | Kim et al. |
| 2011/0300685 A1 | 12/2011 | Horii et al. |
| 2011/0312178 A1 | 12/2011 | Watanabe et al. |
| 2012/0241705 A1 | 9/2012 | Bresolin et al. |
| 2012/0256150 A1 | 10/2012 | Zagrebelny et al. |
| 2012/0256151 A1 | 10/2012 | Liu et al. |
| 2013/0099888 A1 | 4/2013 | Redaelli et al. |
| 2013/0126816 A1 | 5/2013 | Tang et al. |
| 2013/0126822 A1 | 5/2013 | Pellizzer et al. |
| 2013/0277796 A1 | 10/2013 | Yang et al. |
| 2013/0285002 A1 | 10/2013 | Van Gerpen et al. |
| 2014/0117302 A1 | 5/2014 | Goswami |
| 2014/0217350 A1 | 8/2014 | Liu et al. |

FOREIGN PATENT DOCUMENTS

| | | |
|---|---|---|
| WO | PCT/US2012/063962 | 3/2013 |
| WO | WO 2013/039496 | 3/2013 |
| WO | PCT/US2012/063962 | 5/2014 |
| WO | PCT/US2014/011250 | 5/2014 |

OTHER PUBLICATIONS

U.S. Appl. No. 14/242,588, filed Apr. 1, 2014, Lindenberg.

U.S. Appl. No. 14/293,577, filed Jun. 2, 2014, Pellizzer et al.

(56) References Cited

OTHER PUBLICATIONS

U.S. Appl. No. 14/295,770, filed Jun. 4, 2014, Pellizzer.
Bez; Chalcogenide PCM: a Memory Technology for Next Decade; IEEE, 2009, pp. 5.1.1 .5.1.4.
Czubatyj et al., "Current Reduction in Ovonic Memory Devices", downloaded from www.epcos.org/library/papers/pdC2006/pdf.../Czubatyj.pdf; prior to Nov. 17, 2011.
Fazio, "Future Directions of Non-Volatile Memory in Compute Applications", IEEE, 2009, pp. 27.7.1-727,7.4.
Lee et al.; Programming Disturbance and Cell Scaling in Phase Change Memory: For up to 16nm based 4F2 Cell; IEEE, 2010 Symposium on VLSI Technologt Digest of Technical Papers, pp. 199-200.
Raoux et al., Effect of Ion Implantation on Crystallization Properties of Phase Change Materials, presented at E\PCOS201 0 Conference, Sep. 6-7, 2010, Politecnico di Milano, Milan, Italy.
Russo et al.; Modeling of Programming and Read Performance in Phase-Change Memories—Part II: Program Disturb and Mixed-Scaling Approach,. IEEE Transactions on Electron Devices, vol. 55(2), Feb. 2008, pp. 5.15-5.22.
Servalli; A 45nm Generation Phase Change Memory Technology; IEEE 2009; pp. IEDM09-113-IEDM09-116.
Villa et al.;A 45nm 1Gb 1.8V Phase-Change Memory; 2010 IEEE International Solid-State Circuits Conference; Feb. 9, 2010; pp. 270-271.
EP 12850697.9 Search Report, Jun. 9, 2015, Micron Technology, Inc.
PCT/US2014/011250 IPRP, Aug. 11, 2015, Micron Technology, Inc.

* cited by examiner

METHODS OF FORMING MEMORY CELLS

TECHNICAL FIELD

Memory arrays and methods of forming memory cells.

BACKGROUND

Memory is one type of integrated circuitry, and is used in computer systems for storing data. Integrated memory is usually fabricated in one or more arrays of individual memory cells. The memory cells are configured to retain or store memory in at least two different selectable states. In a binary system, the states are considered as either a "0" or a "1". In other systems, at least some individual memory cells may be configured to store more than two levels or states of information.

Integrated circuit fabrication continues to strive to produce smaller and denser integrated circuits. Accordingly, there has been substantial interest in memory cells that can be utilized in cross-point architectures. Example types of memory cells that are suitable for utilization in cross-point architectures are resistive RAM (RRAM) cells, phase change RAM (PCRAM) cells, and programmable metallization cells (PMCs)—which may be alternatively referred to as a conductive bridging RAM (CBRAM) cells, nanobridge memory cells, or electrolyte memory cells. The memory cell types are not mutually exclusive. For example, RRAM may be considered to encompass PCRAM and PMCs.

The cross-point architectures may comprise memory cell material between a pair of electrodes. Various problems can be encountered in the development of such architectures. The problems can involve, for example, mask misalignment during the various patterning steps utilized to pattern the electrodes and the memory cell material. Each electrode may be patterned with a separate masking step, and the memory cell material may be patterned with yet another masking step. Thus, there can be at least three masking steps to align during the fabrication of the memory cells. As another example, the problems may involve difficulties in utilizing some types of memory cell materials. For instance, some memory cell materials comprise oxides which are reactive toward many conductive materials. Thus it can be desired to use noble metals (for instance, platinum, silver, etc.) in electrodes that contact such oxides. However, the non-reactivity of the noble metals can make them difficult to pattern.

It would be desirable to develop improvements in memory cell fabrication which alleviate one or more of the above-discussed problems, and to develop improved memory cells.

DETAILED DESCRIPTION OF THE ILLUSTRATED EMBODIMENTS

In some embodiments, the invention includes a two-mask, damascene scheme that may be utilized for forming cross-point memory. In some embodiments, the scheme may be utilized for patterning select devices (for instance, diodes, transistors, etc.) in addition to memory cells; and in some embodiments the scheme may be utilized for patterning memory cells separate from select devices. The scheme may be utilized for patterning noble metals, and may be utilized in combination with pitch-multiplication technologies. In some embodiments, the scheme may be utilized for forming highly integrated memory; such as, for example, memory having feature sizes of less than or equal to about 20 nanometers.

Example embodiments are described with reference to FIGS. 1-24.

Figure 1:
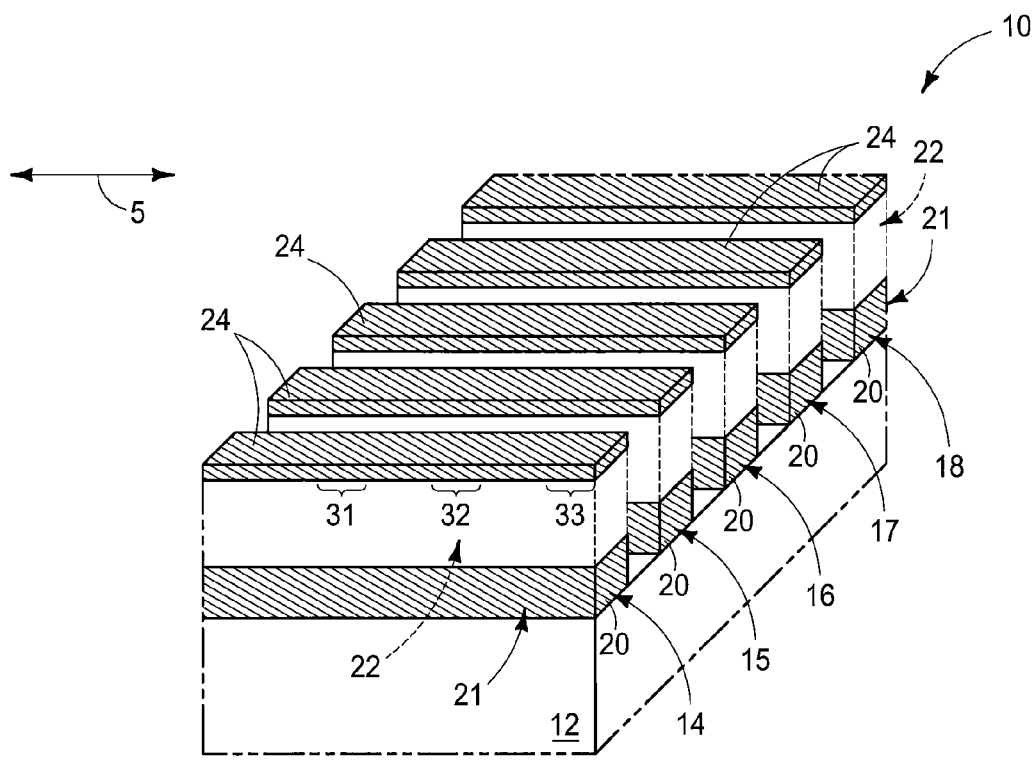
FIGS. 1-7 are diagrammatic three-dimensional views of a portion of a construction shown at various process stages of an example embodiment method of fabricating memory cells.

Referring to FIG. 1, a construction 10 comprises an electrically insulative material 12 supporting a plurality of rails 14-18. The rails are elongated along a direction of an illustrated axis 5 in the shown embodiment, and such axis may be referred to as a first axis. Although the rails are substantially straight in the shown embodiment, in other embodiments the rails may be curved or wavy. Even if the rails are curved or wavy, such rails may extend primarily along the illustrated axis 5 in some embodiments.

The electrically insulative material 12 may comprise any suitable composition or combination of compositions, and in some embodiments may comprise one or more of silicon nitride, silicon dioxide, and any of various doped glasses (for instance, borophosphosilicate glass, phosphosilicate glass, fluorosilicate glass, etc.). The insulative material 12 may be supported over a semiconductor base (not shown). Such base may comprise, for example, monocrystalline silicon. If the electrically insulative material is supported by a semiconductor base, the combination of the electrically insulative material 12 and the underlying semiconductor base may be referred to as a semiconductor substrate, or as a portion of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some embodiments, the insulative material 12 may be over a semiconductor construction which comprises a semiconductor base and one or more levels of integrated circuitry. In such embodiments, the levels of integrated circuitry may comprise, for example, one or more of refractory metal materials, barrier materials, diffusion materials, insulator materials, etc.

The rails 14-18 may comprise several stacked materials in some embodiments. The bottom material of the shown rails is an electrically conductive material 20. Such electrically conductive material may comprise any suitable composition or combination of compositions; and in some embodiments may comprise, consist essentially of, or consist of one or more of various metals (for instance, tungsten, titanium, copper, etc.), metal-containing substances (for instance, metal nitride, metal silicide, metal carbide, etc.) and conductively-doped semiconductor materials (for instance, conductively-doped silicon, conductively-doped germanium, etc.). The electrically conductive material 20 forms electrically conductive lines 21 (only some of which are labeled) contained within the series of rails 14-18. Such electrically conductive lines may correspond to access/sense lines; and may, for example, correspond to wordlines or bitlines in some embodiments. The lines 21 may be referred to as a first series of lines to distinguish them from another series of lines formed in subsequent processing.

The individual rails 14-18 comprise one or more materials over the lines 21. The materials over lines 21 are diagrammatically illustrated as regions 22 (only some of which are labeled) over the individual lines 21. Uppermost portions of the regions 22 comprise electrically conductive material 24. The uppermost surface of material 24 may ultimately correspond to the top of a bottom electrode of a memory cell. In other words, the uppermost surface of material 24 may be a region where a bottom electrode of a memory cell contacts memory cell material (described below); and thus material 24 may be referred to as bottom electrode contact material.

Materials 20 and 24 may or may not comprise the same composition as one another. In some embodiments, materials 20 and 24 may be the same conductive material as one another, and the intervening segment of region 22 may simply be more of the same conductive material. In other embodiments, region 22 may comprise one or more materials suitable for fabrication into select devices (for instance, transistors, diodes, etc.)—with an example of such other embodiments being described below with reference to FIGS. 8-12.

Each of the rails 14-18 extends along multiple memory cell locations, with example memory cell locations 31-33 being labeled relative to the rail 14. Ultimately, memory cells may be fabricated within such memory cell locations such that memory cell material of the memory cells is directly against the bottom electrode contact material 24 (as shown, for example, in FIG. 7).

The rails 14-18 may be formed with any suitable processing. For instance, the various materials of the rails 14-18 may be formed across substrate 12, and a patterned mask (not shown) may be formed over such materials to define locations of the rails 14-18. A pattern may then be transferred from the mask into the materials of the rails with one or more suitable etches, and then the mask may be removed to leave the shown construction of FIG. 1. The mask may comprise any suitable composition or combination of compositions. For instance, the mask may comprise photolithographically-patterned photoresist. As another example, the mask may comprise one or more materials patterned utilizing pitch-multiplication methodologies.

Figure 2:
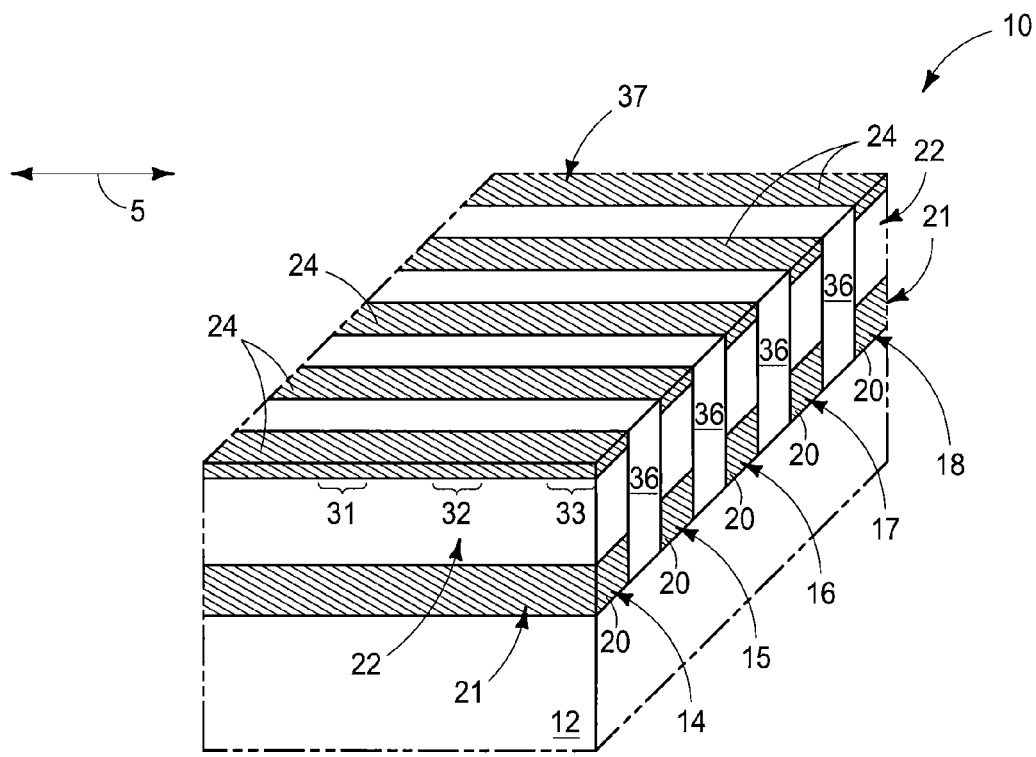

In the shown embodiment of FIG. 1, the rails 14-18 are spaced from one another by intervening gaps. FIG. 2 shows dielectric material 36 formed within such gaps. The dielectric material may comprise any suitable composition or combination of compositions; and in some embodiments may comprise, consist essentially of or consist of silicon dioxide. The construction of FIG. 2 is shown to have a planarized surface 37 extending across rails 14-18, and across the dielectric material 36. Such construction may be formed by initially forming dielectric material 36 to fill the gaps between the rails 14-18, and to extend across upper surfaces of the rails; and then utilizing chemical-mechanical polishing (CMP) to remove the dielectric material from over the rails and form the planarized surface 37.

Figure 3:
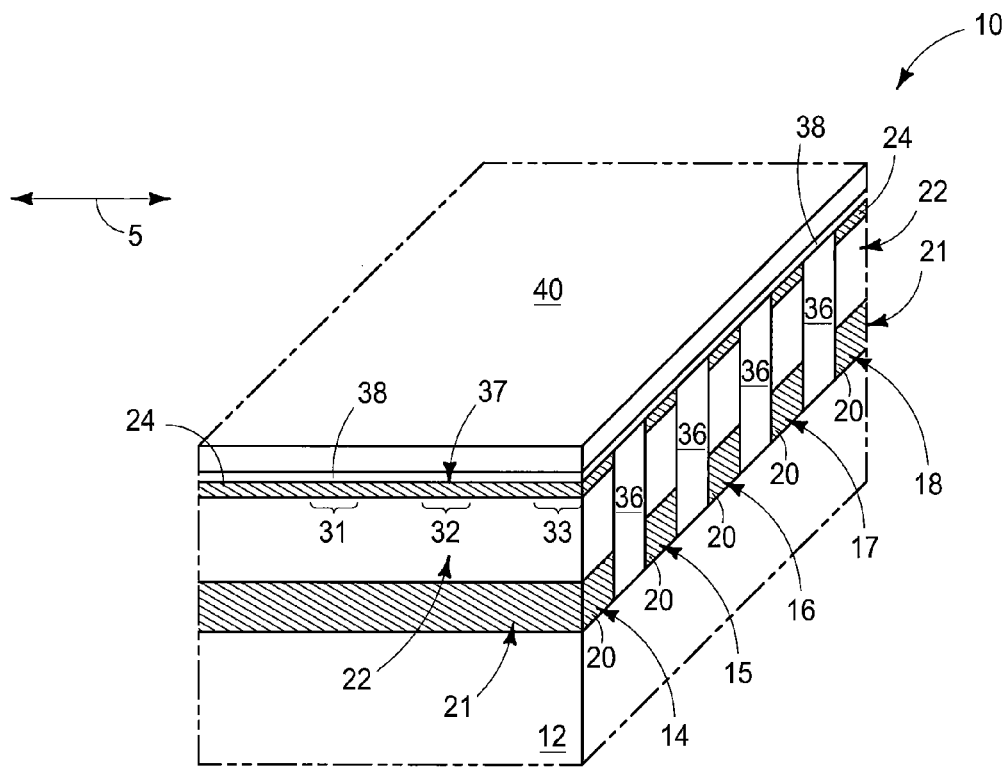

Referring to FIG. 3, an expanse of pad material 38 is formed across the planarized upper surface 37, and an expanse of sacrificial material 40 is formed across the pad material.

In some embodiments, the pad material may comprise a sacrificial material provided as a buffer between the material 40 and the bottom electrode contact material 24. In some embodiments, the pad material may be omitted and the sacrificial material 40 may be provided directly on the bottom electrode contact material. In some embodiments, the pad material may correspond to a memory cell material which is ultimately incorporated into memory cells. The memory cell material may be any material either now known, or yet to be developed, which is suitable for utilization in cross-point memory. For instance, the memory cell material may be a material suitable for utilization in one or more of PCRAM, RRAM, CBRAM, PCM, etc. In some embodiments, the memory cell material may comprise an oxide containing one or more of aluminum, antimony, barium, calcium, cesium, germanium, hafnium, iron, lanthanum, lead, manganese, praseodymium, ruthenium, samarium, selenium, silicon, strontium, sulfur, tellurium, titanium, yttrium and zirconium. In some embodiments, the memory cell material may comprise multivalent metal oxide; and may, for example, comprise, consist essentially of or consist of one or more of barium, ruthenium, strontium, titanium, calcium, manganese, praseodymium, lanthanum and samarium. For instance, the multivalent metal oxide may comprise, consist essentially of, or consist of calcium manganese oxide doped with one or more of Pr, La, Sr and Sm. In some embodiments, the memory cell material may comprise chalcogenide-type materials (for instance, materials comprising germanium in combination with one or more of antimony, tellurium, sulfur and selenium). In some embodiments, the memory cell material may include additional layers, such as an ion source material suitable for contributing ions which ultimately form conductive bridges in PMC devices. The ion source material may comprise, for example, one or both of copper and silver; and may thus be configured for contributing copper cations and/or silver cations for formation of a conductive bridge. For instance, the ion source material may comprise a combination of copper and tellurium. The memory cell material may be a solid, gel, or any other suitable phase.

Since the material 38 may be alternatively either a sacrificial material or a memory cell material in some embodiments, the material 38 may be referred to herein as a pad material, sacrificial material, or memory cell material in describing various different embodiments. The term "pad material" as utilized in referring to material 38 is generic relative to the terms "sacrificial material" and "memory cell material."

The sacrificial material 40 may comprise any suitable composition or combination of compositions; and in some embodiments may comprise, consist essentially of, or consist of silicon (for instance, may consist of one or both of amorphous silicon and polycrystalline silicon).

Figure 4:
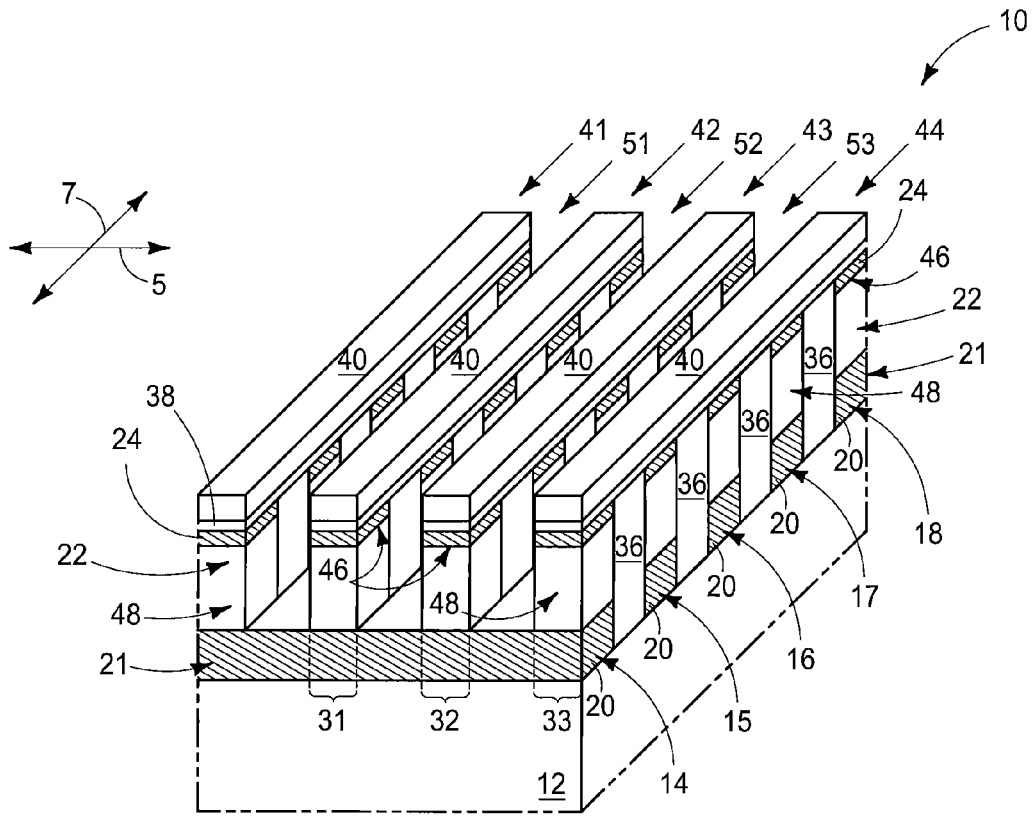

Referring to FIG. 4, the sacrificial material 40 is patterned into a series of lines 41-44. The lines 41-44 may be referred to as a second series of lines to distinguish them from the first series of lines corresponding to the lines 21 contained within the rails 14-18. The lines 41-44 cross the rails 14-18; and in the shown embodiment are substantially orthogonal to the rails 14-18. Specifically, the lines 41-44 are elongated along an axis 7, and the rails 14-18 are elongated along the axis 5 which is substantially orthogonal to the axis 7. The term "substantially orthogonal" is utilized to indicate that the two axes are orthogonal within reasonable tolerances of design and measurement.

The sacrificial material lines 41-44 are directly over the memory cell locations (for instance, the locations 31-33). The pattern of the sacrificial material lines 41-44 is transferred into the bottom electrode contact material 24 to singulate such material into segments 46 (only some of which are labeled). Each segment is associated with only a single memory cell location. The pattern may be transferred into the bottom electrode contact material with any suitable etch or combination of etches.

The pattern of the sacrificial material lines is also transferred into the one or more materials beneath the bottom electrode contact material of the rails 14-18. Such singulates the regions 22 into pedestals (or pillars) 48 (only some of which are labeled). In embodiments in which the regions 22 comprise materials suitable for incorporation into select devices, the singulation of regions 22 into pedestals 48 may form individual select devices. For instance, FIGS. 8-12 describe an embodiment in which the singulation forms individual diodes. The pattern may be transferred into the one or more materials of regions 22 with any suitable etch or combination of etches. The pedestals 48 are capped with the bottom electrode contact material 24, and are directly between the memory cell locations (for instance, the locations 31-33) and the conductive material 20.

The sacrificial material 40 may be patterned into the lines 41-44 with any suitable processing. For instance, a patterned mask (not shown) may be formed over sacrificial material 40 to define locations of the lines 41-44, a pattern may be transferred from the mask into material 40 with one or more suitable etches, and then the mask may be removed. The mask may comprise any suitable composition or combination of compositions. For instance, the mask may comprise photolithographically-patterned photoresist. As another example, the mask may comprise one or more materials patterned utilizing pitch-multiplication methodologies. The mask may remain during the patterning of the materials of regions 22 in some embodiments, and may be removed prior to such patterning in other embodiments.

The illustrated construction 10 at the processing stage of FIG. 4 has a plurality of trenches 51-53 formed between the lines 41-44. The trenches 51-53 extend along the same direction as the lines 41-44. In some embodiments, the trenches 51-53 may be referred to as a first series of trenches.

Figure 5:
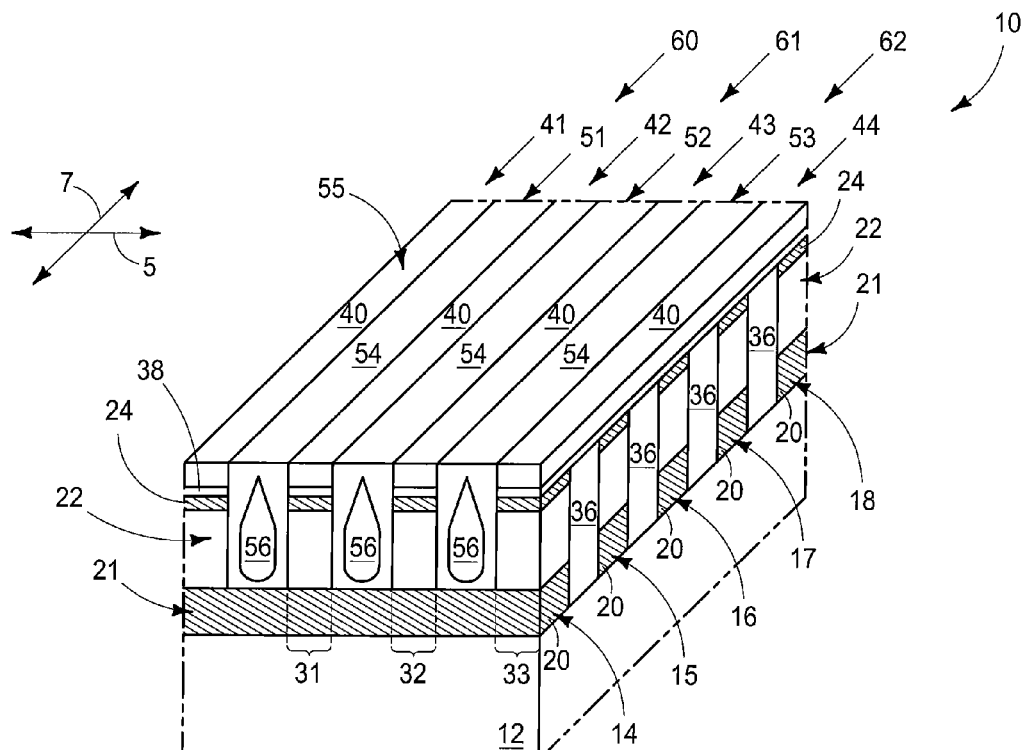

Referring to FIG. 5, dielectric material 54 is formed within the trenches 51-53. Although a single dielectric material is shown, in other embodiments multiple dielectric materials may be formed within such trenches. In some embodiments, the dielectric formed within the trenches 51-53 may comprise one or both of silicon nitride and silicon carbide. The material 54 may be formed with any suitable processing, including, for example, one or more of atomic layer deposition (ALD), chemical vapor deposition (CVD) and physical vapor deposition (PVD). In some embodiments, material 54 may be formed to extend across upper surfaces of lines 41-44, and may then be subjected to CMP to form the illustrated planarized upper surface 55.

In the shown embodiment, the material 54 is deposited under conditions which leave voids 56 within trenches 51-53. Suitable conditions for leaving such voids are conditions in which the dielectric material pinches off across the tops of the trenches before uniformly filling central regions of the trenches. It can be advantageous that the dielectric provided within trenches 51-53 have a low dielectric constant in that such can alleviate or prevent cross-talk that may otherwise occur between memory cells on opposing sides of the trenches. Air has a low dielectric constant, and thus it can be advantageous to have the illustrated voids remaining within the trenches after formation of dielectric material 54 within such trenches.

In some embodiments, the dielectric within the trenches 51-53 may be referred to as dielectric lines 60-62. In the shown embodiment, such dielectric lines comprise the illustrated voids 56 in combination with dielectric material 54. In some embodiments, the illustrated voids 56 may consume at least about 10 percent of the volume of the dielectric lines formed within the trenches.

Although voids 56 are present in the shown embodiment, in other embodiments the dielectric 54 may be provided to entirely fill trenches 51-53. Thus, the voids may be omitted.

Figure 6:
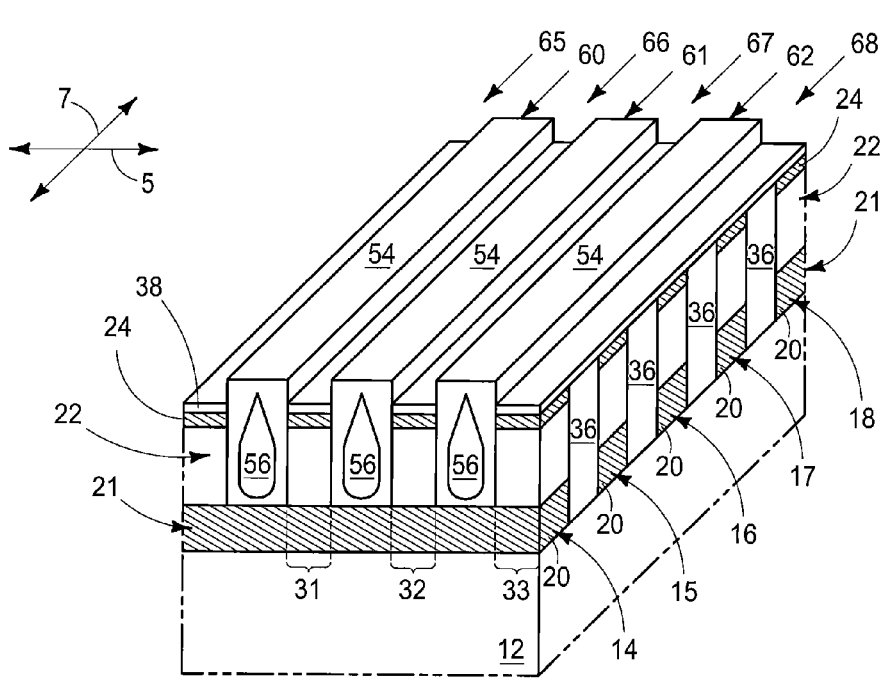

Referring to FIG. 6, sacrificial material 40 (FIG. 5) is removed to leave trenches 65-68. The trenches 65-68 may be referred to as a second series of trenches to distinguish them from the first series of trenches 51-53 (FIG. 4). If the sacrificial material consists of silicon (for instance, polycrystalline silicon), such may be removed utilizing tetramethylammonium hydroxide in some embodiments.

The trenches 65-68 are directly over the bottom electrode contact material 24. In the shown embodiment, the formation of trenches 65-68 exposes memory cell material 38. In other embodiments, material 38 may correspond to a sacrificial pad material which is removed from over bottom electrode contact material 24, and then replaced with memory cell material. In yet other embodiments, material 38 may be omitted (as discussed above with reference to FIG. 3); and in such embodiments the memory cell material may be formed subsequent to the formation of the trenches 65-68 to create the shown construction of FIG. 6.

The memory cell material 38 in the embodiment of FIG. 6 is configured as a planar sheet. If the memory cell material is deposited after removal of sacrificial material 40 (FIG. 5), the memory cell material may have a different configuration. For instance, FIG. 14 (discussed below) shows an embodiment in which memory cell material is configured as upwardly-opening container structures.

Although only the single memory cell material 38 is shown in the embodiment of FIG. 6, in other embodiments multiple memory cell materials may be utilized. The one or more memory cell materials may be any materials suitable for forming cross-point memory cells, either now known or later developed. For instance, the memory cell materials may be suitable for utilization in one or more of PCRAM, RRAM, CBRAM, PCM, etc.

Figure 7:
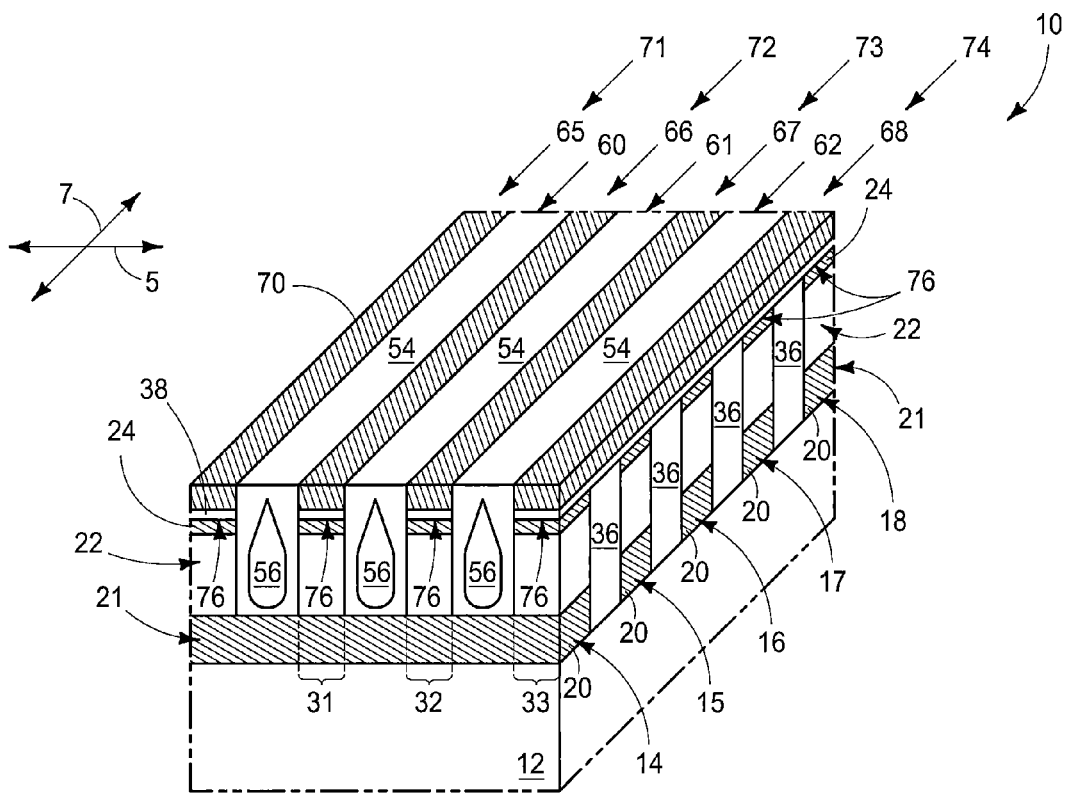

Referring to FIG. 7, top electrode material 70 is formed within the trenches 65-68. The top electrode material may comprise any suitable composition or combination of compositions, and in some embodiments may comprise, consist essentially of, or consist of one or more of platinum, silver and copper. Accordingly, the top electrode material may comprise, consist essentially of, or consist of one or more noble metals. As discussed above in the "background" section of this disclosure, it can be difficult to pattern noble metals. However, in some embodiments the trenches 65-68 enable utilization of a damascene process for patterning the electrode material 70. Specifically, top electrode material 70 may be formed to fill trenches 65-68 and to extend over dielectric lines 60-62. The top electrode material may then be planarized (for instance, subjected to CMP) to remove the top electrode material 70 from over the dielectric material lines and thereby form the illustrated top electrode lines 71-74.

Such top electrode lines extend along the axis 7, and thus cross the bottom electrode lines 21.

In some embodiments, the top electrode material 70 may comprise copper. In such embodiments, it may be desired for dielectric 54 to comprise copper barrier material, such as one or more nitrides and/or it may be desired for the conductive top electrode material to be surrounded by electrically conductive barrier material.

Memory cells 76 (only some of which are labeled) are formed in the memory cell locations (for instance, the locations 31-33), with such memory cells having memory cell material 38 directly between the bottom electrode contact material 24 and the electrode material 70. The memory cells may be considered to be configured as a memory array.

In some embodiments, the formation of the top electrode lines 71-74 may be considered to be replacement of at least some of the sacrificial material 40 of lines 41-44 (FIG. 5) with top electrode material 70. In the shown embodiment, all of the sacrificial material 40 of lines 41-44 is replaced with electrode material 70. In some embodiments, memory cell material may be formed within trenches 65-68 prior to formation of the electrode material 70; and in such embodiments a portion of the sacrificial material 40 of lines 41-44 may be considered to be replaced with the memory cell material, and another portion of the sacrificial material 40 of lines 41-44 may be considered to be replaced with the electrode material 70.

As discussed above, in some embodiments the materials of region 22 (FIG. 1) may correspond to materials suitable for forming select devices. Example select devices are transistors (for instance, vertical transistors) and diodes. FIGS. 8-12 illustrate an example embodiment in which region 22 comprises materials suitable for fabrication into diodes.

Figure 8:
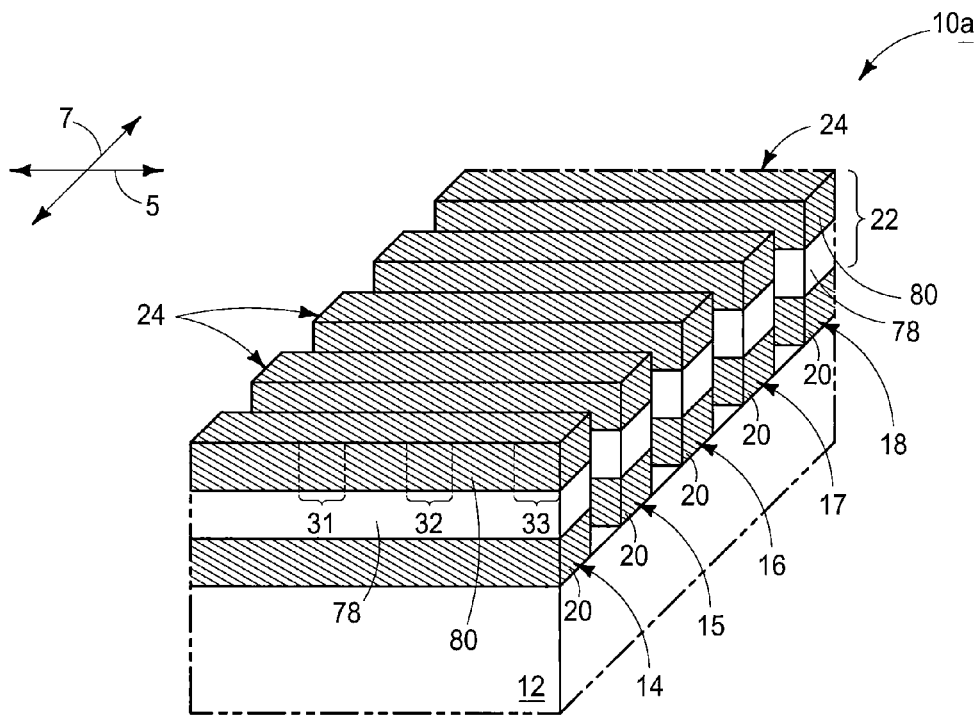
FIGS. 8-12 are diagrammatic three-dimensional views of a portion of a construction shown at various process stages of another example embodiment method of fabricating memory cells.

Referring to FIG. 8, a construction 10a is shown at a processing stage analogous to that of FIG. 1. The rails 14-18 comprise stacks of materials 20, 78 and 80. Such materials may correspond to suitable compositions for a diode construction. For instance, materials 20, 78 and 80 may be suitable compositions for a metal-silicon-metal diode (specifically, materials 20 and 80 may be metal, and material 78 may be silicon), or may be suitable compositions for a PIN diode (specifically, region 78 may be intrinsic semiconductor material, one of the regions 20 and 80 may be n-type doped semiconductor material, and the other of the regions 20 and 80 may be p-type doped semiconductor material). The bottom electrode contact material 24 is shown to correspond to a top surface of material 80. In some embodiments, the bottom electrode contact material may be a separate conductive material from the material 80 of the diode compositions rather than being the shown top surface of material 80. Also, although conductive line 20 is shown to also be one of the diode compositions, in other embodiments the line may be a separate conductive material from the bottom diode composition.

The diode compositions 20, 78 and 80 extend along the memory cell locations (for instance, the locations 31-33).

Figure 9:
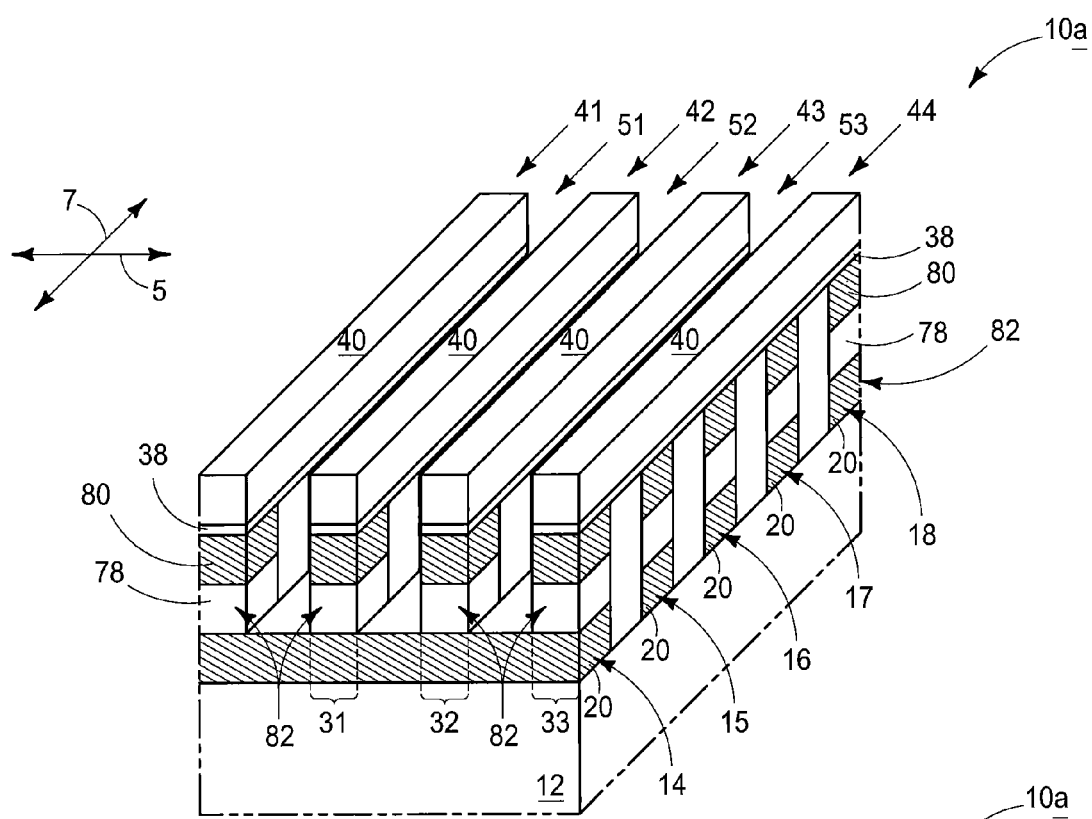

Referring to FIG. 9, construction 10a is shown at a processing stage analogous to the above-discussed processing stage of FIG. 4. Accordingly, the pad material 38 and sacrificial material 40 have been formed over rails 14-18, and then the construction has been subjected to patterning to form the lines 41-44 and the trenches 51-53. The formation of the trenches singulates diodes 82 (only some of which are labeled) from the diode compositions 20, 78 and 80. Specifically, the trenches extend through materials 78 and 80 to form individual diodes under individual memory cell locations (for instance, the memory cell locations 31-33). In embodiments in which the bottom diode composition is a different conductive material from the material of the conductive line 20, the trenches may extend through the bottom diode composition in addition to extending through the diode compositions 78 and 80.

Figure 10:
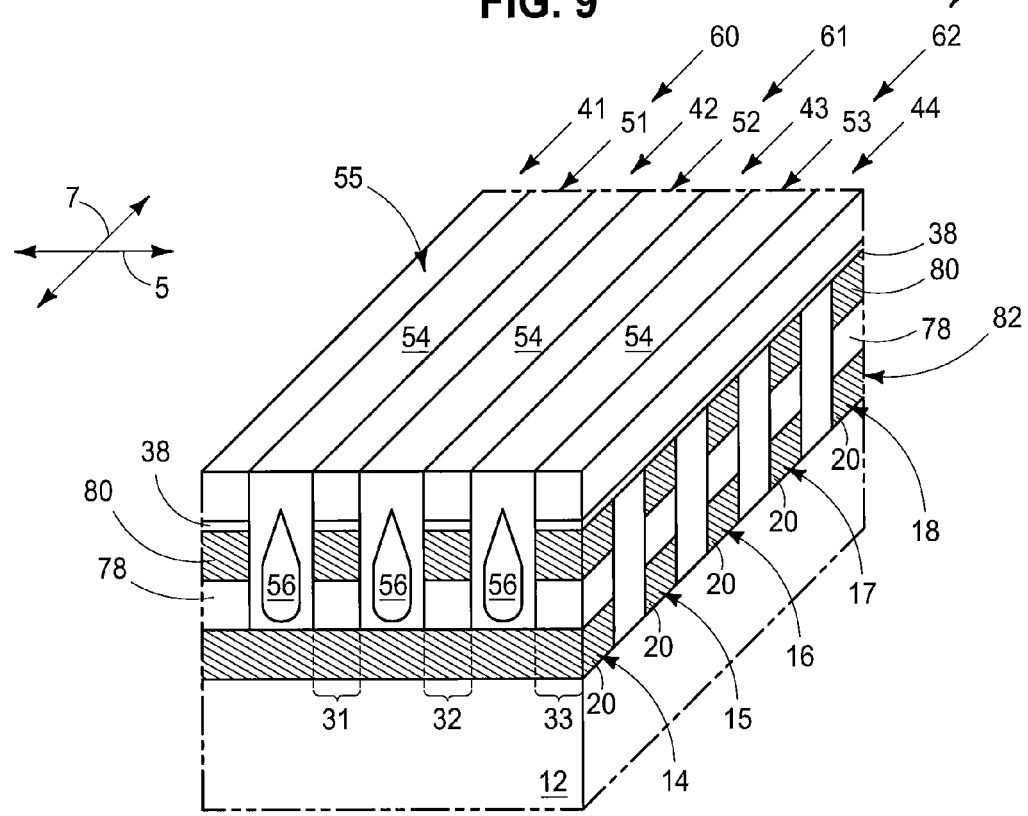

Referring to FIG. 10, construction 10a is shown at a processing stage analogous to the above-discussed processing stage of FIG. 5. The construction comprises the dielectric lines 60-62 within the trenches 51-53. Such dielectric lines comprise the voids 56 in combination with the dielectric material 54 in the shown embodiment. The construction 10a also comprises the planarized upper surface 55.

Figure 11:
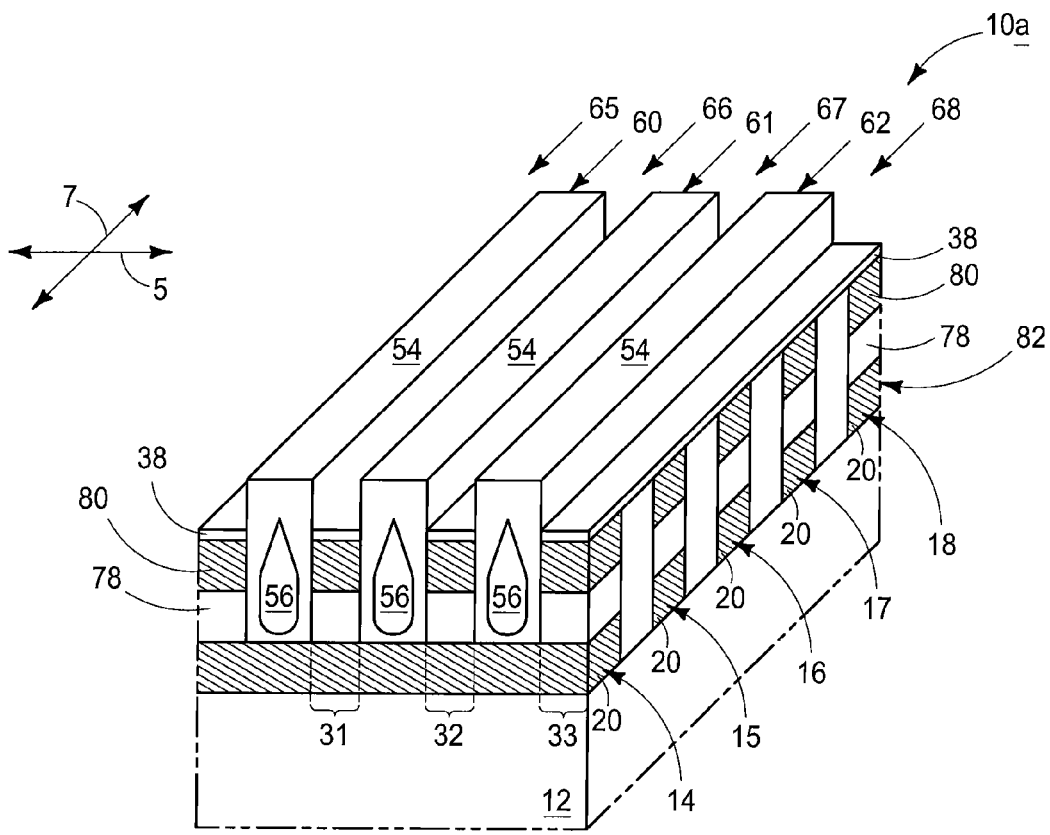

Referring to FIG. 11, construction 10a is shown at a processing stage analogous to that discussed above with reference to FIG. 6. The sacrificial material 40 (FIG. 10) has been removed to leave the trenches 65-68 between the dielectric lines 60-62. The material 38 is at the bottoms of the trenches 65-68, and corresponds to memory cell material of the type described above with reference to FIG. 6. In other embodiments, the material 38 may be sacrificial material which is removed and replaced with memory cell material, as discussed above with reference to FIG. 6.

Figure 12:
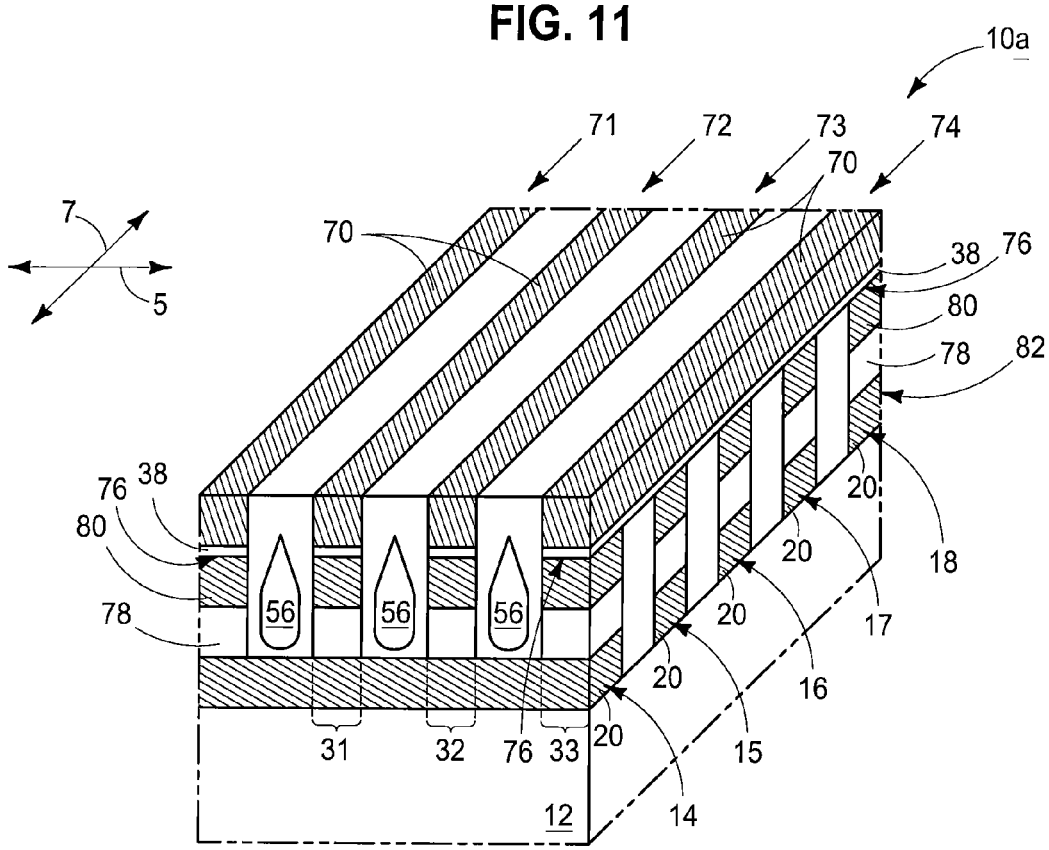

Referring to FIG. 12, construction 10a is shown at a processing stage analogous to that discussed above with reference to FIG. 7. Top electrode material 70 has been formed within the trenches 65-68 and patterned to form the top electrode lines 71-74.

Memory cells 76 (only some of which are labeled) are formed in the memory cell locations (for instance, the locations 31-33), with such memory cells having memory cell material 38 directly between the bottom electrode contact material 24 and the electrode material 70. Each memory cell is directly over one of the diodes 82.

The embodiment of FIGS. 8-12 singulates the diodes 82 during patterning of the memory cell material 38, which consolidates process steps relative to prior art processing. Such may improve throughput of a fabrication process relative to prior art processes, and may eliminate masking steps relative to prior art processes.

Figure 13:
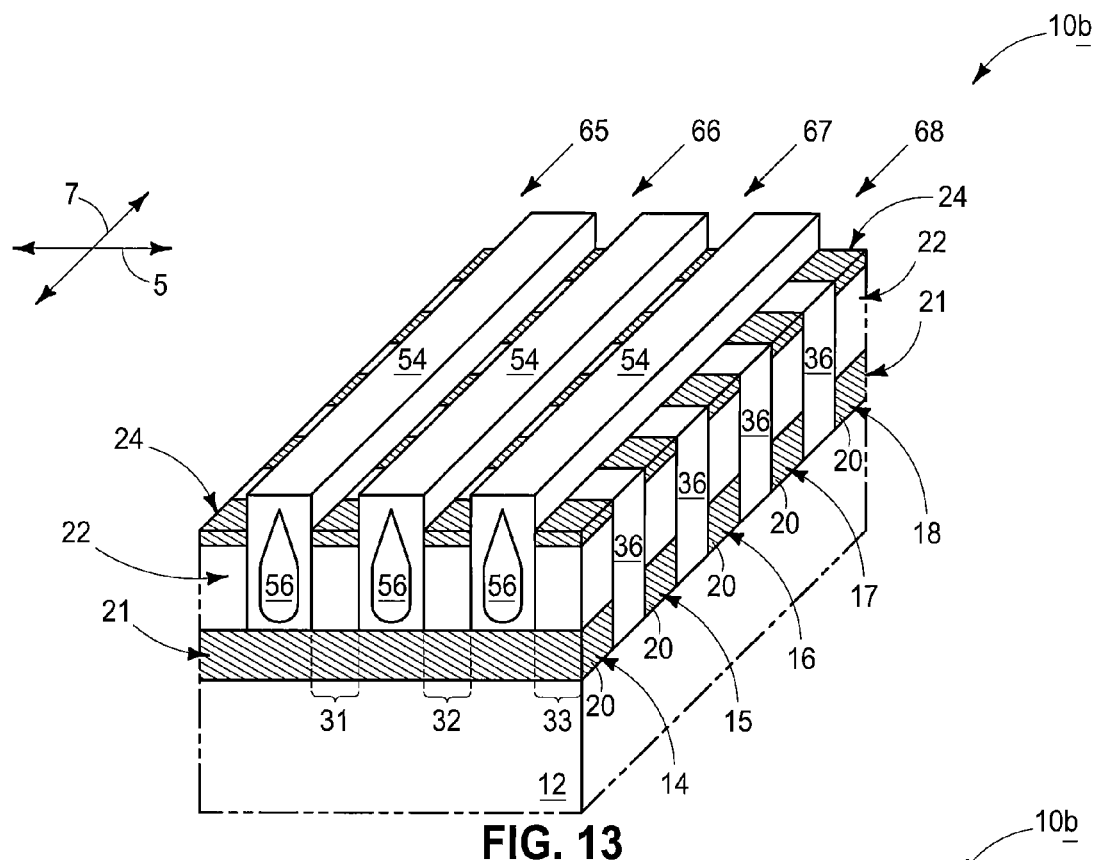
FIGS. 13 and 14 are diagrammatic three-dimensional views of a portion of a construction shown at various process stages of another example embodiment method of fabricating memory cells.
Figure 14:
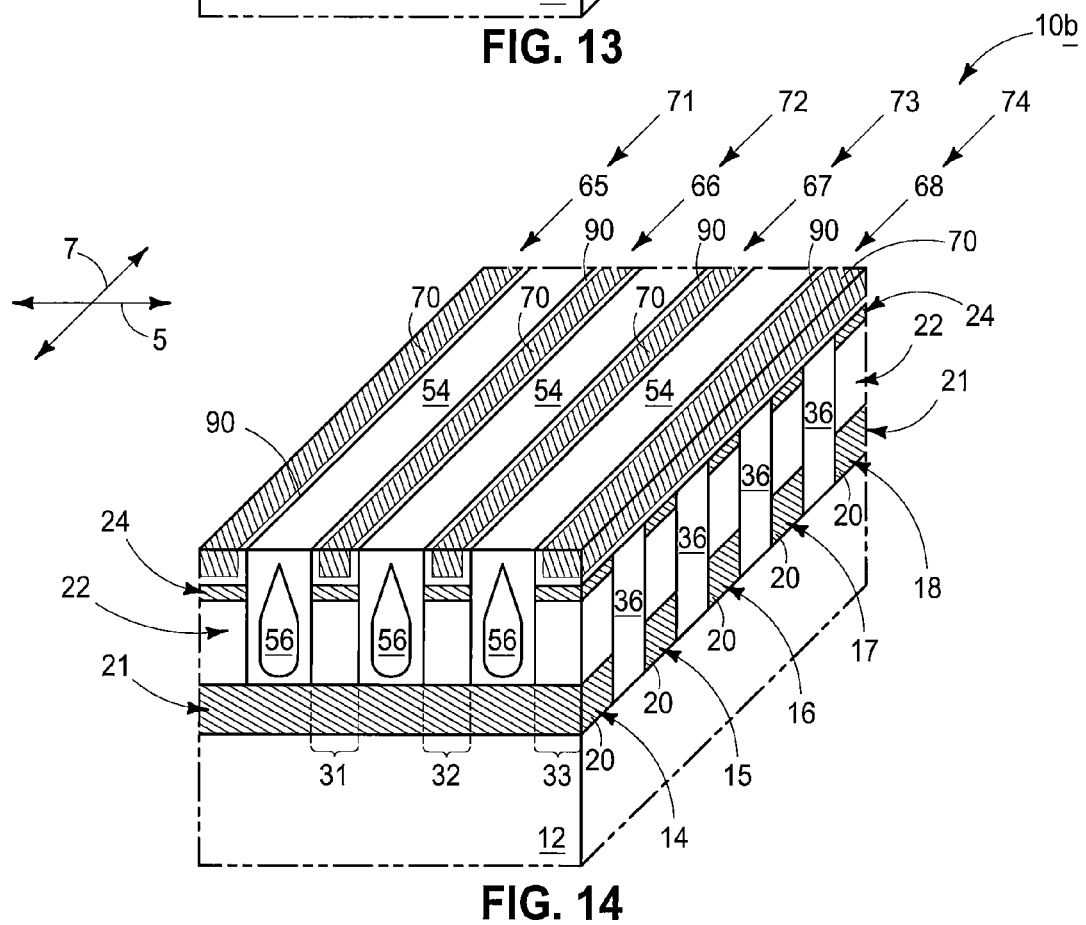

FIGS. 13 and 14 illustrate another example embodiment method.

Referring to FIG. 13, a construction 10b is shown at a processing stage analogous to that described above with reference to FIG. 6. However, unlike the embodiment of FIG. 6 which had the pad material 38 at the bottoms of the trenches 65-68, the embodiment of FIG. 13 does not have such pad material at the bottoms of such trenches.

Referring to FIG. 14, memory cell material 90 is formed within the trenches 65-68 to line such trenches. The memory cell material forms upwardly-opening container structures within the trenches. Subsequently, top electrode material 70 is formed within such upwardly-opening container structures and patterned to form the top electrode lines 71-74.

Figure 15:
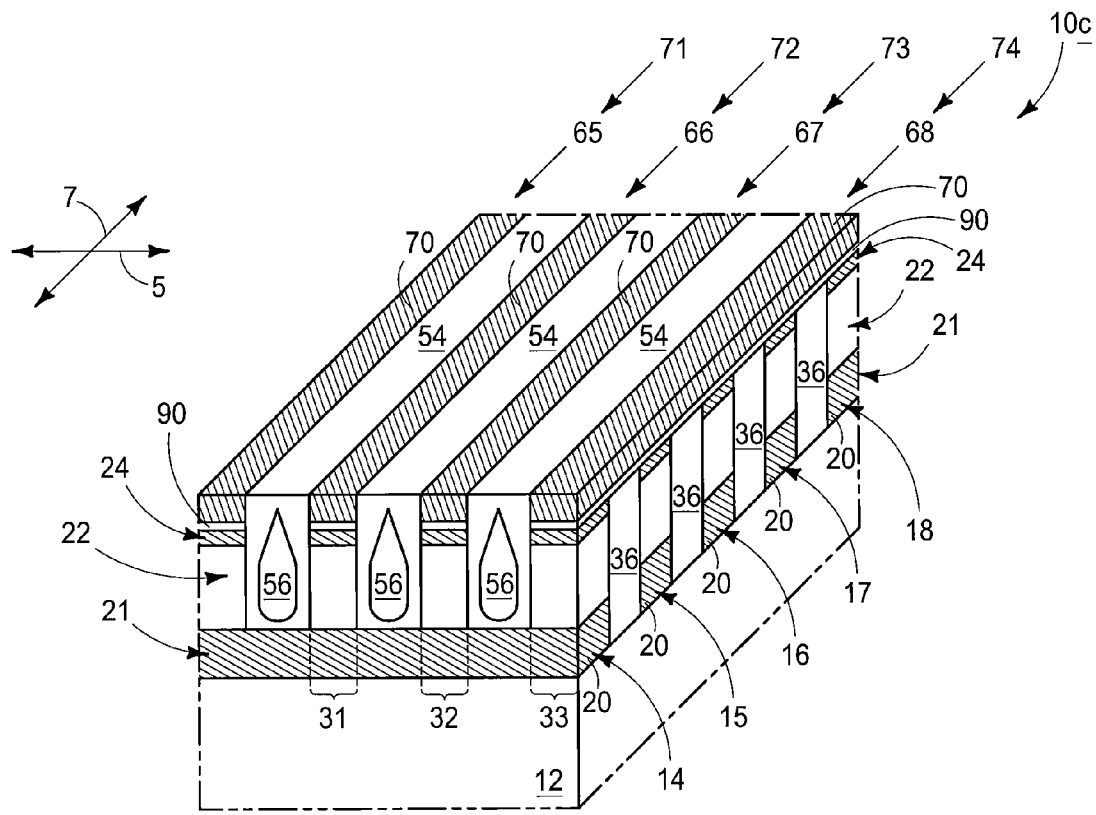
FIG. 15 is a diagrammatic three-dimensional view of a portion of a construction shown at a process stage of another example embodiment method of fabricating memory cells.

In some embodiments, the memory cell material 90 may be formed as a planar structure rather than as the container-shaped structure of FIG. 14. For instance, FIG. 15 shows a construction 10c at a processing stage analogous to that of FIG. 14, but in which the memory cell material 90 has been formed as a planar structure.

Figure 16:
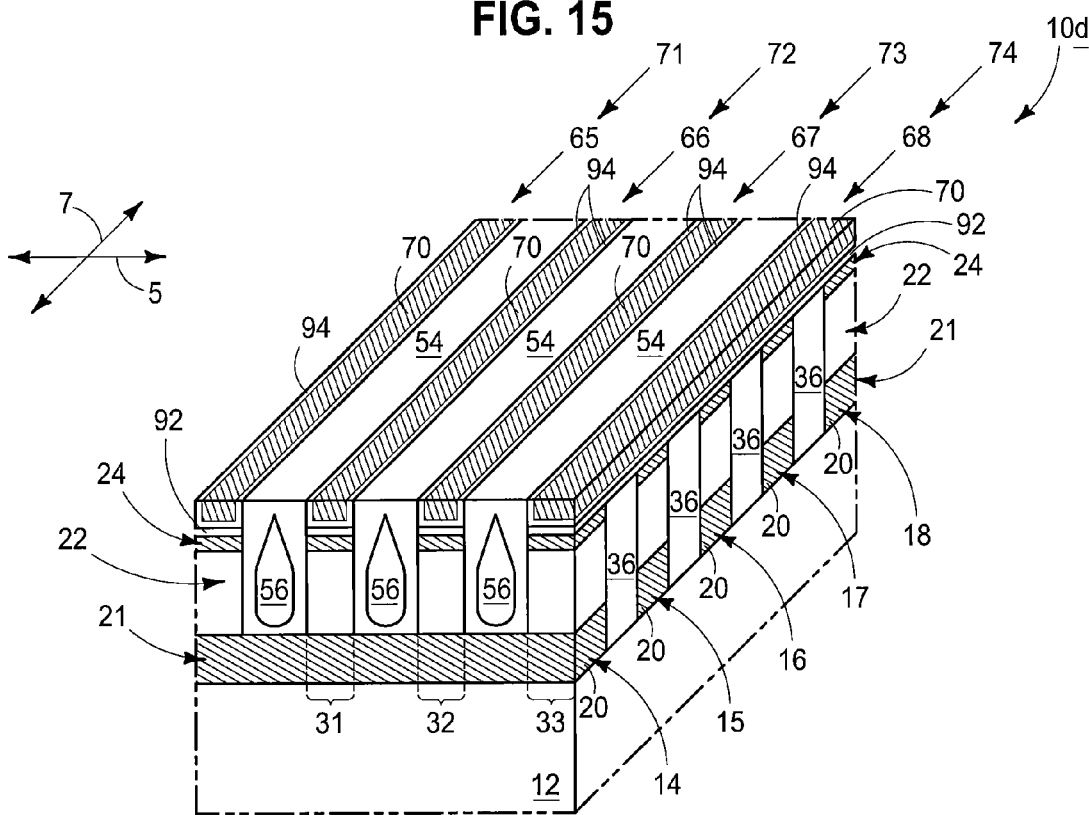
FIG. 16 is a diagrammatic three-dimensional view of a portion of a construction shown at a process stage of another example embodiment method of fabricating memory cells.

In some embodiments, multiple memory cell materials may be utilized in the memory cells. In such embodiments, the memory cell materials may have different shapes relative to one another. For instance, FIG. 16 shows a construction 10d utilizing two different memory cell materials 92 and 94. The memory cell material 92 is configured as a planar structure, and the memory cell material 94 is configured as a container-shaped structure provided directly over and directly against the memory cell material 92. The memory cell materials 92 and 94 may be referred to as first and second memory cell materials, respectively.

In some embodiments, the memory cell material 92 may correspond to the pad material 38 of FIG. 6, and the material 94 may be provided within trenches 65-68 prior to forming the top electrode material 70 of FIG. 7. In other embodiments, the memory cell materials 92 and 94 may both be formed within trenches 65-68 following a process stage analogous to that of FIG. 13 so that neither of the memory cell materials corresponds to the pad material 38 of FIG. 6.

The utilization of two memory cell materials may be useful in, for example, forming PCM cells in which one of the memory cell materials is an ion source (for instance, a combination of copper and tellurium) and the other is a switching region (for instance, an oxide or solid state electrolyte); forming RRAM cells in which one of the memory cell materials is a multivalent oxide and the other is a high k dielectric; etc. In some embodiments, more than two memory cell materials may be utilized.

In some embodiments, a construction analogous to that of FIG. 16 may be configured to have the electrode material 70 comprise copper, and the container-shaped material 94 may comprise a copper barrier material (such as a nitride). In such embodiments, the material 94 may or may not be a memory cell material.

Figure 17:
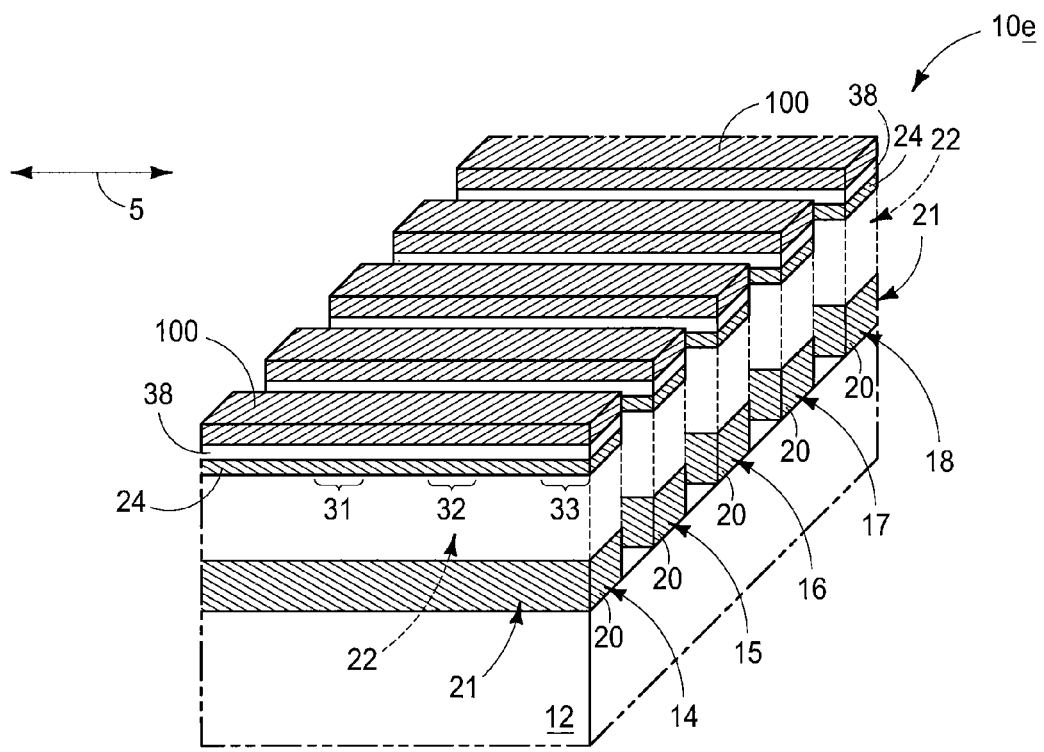
FIGS. 17-23 are diagrammatic three-dimensional views of a portion of a construction shown at various process stages of another example embodiment method of fabricating memory cells.
Figure 18:
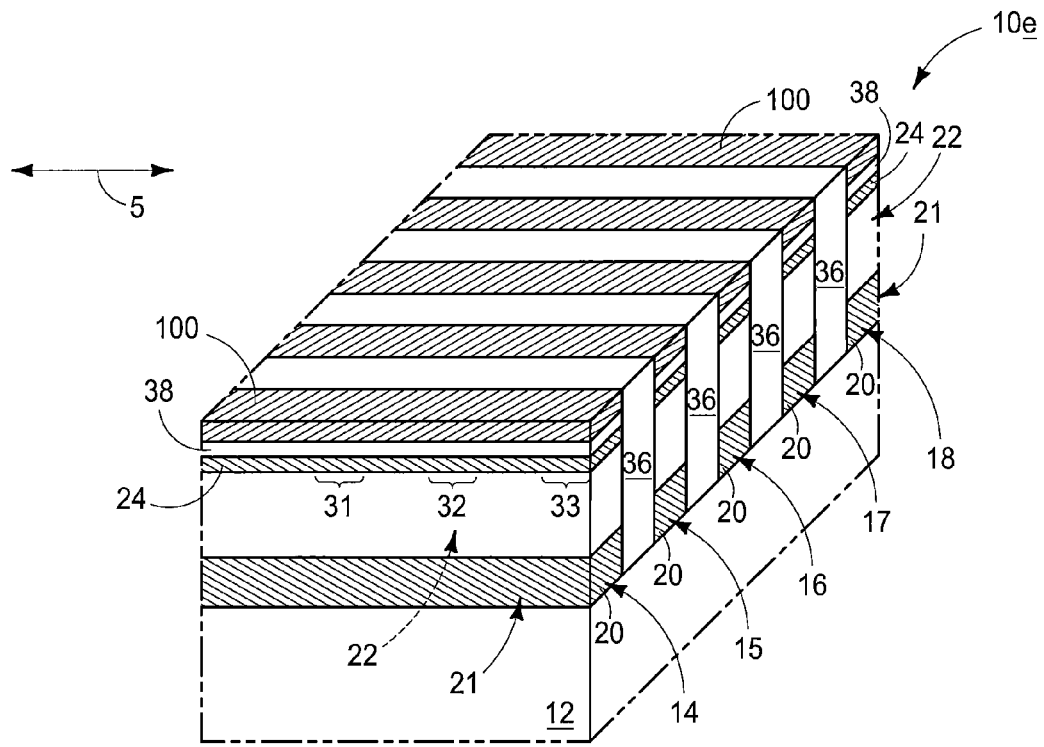
Figure 19:
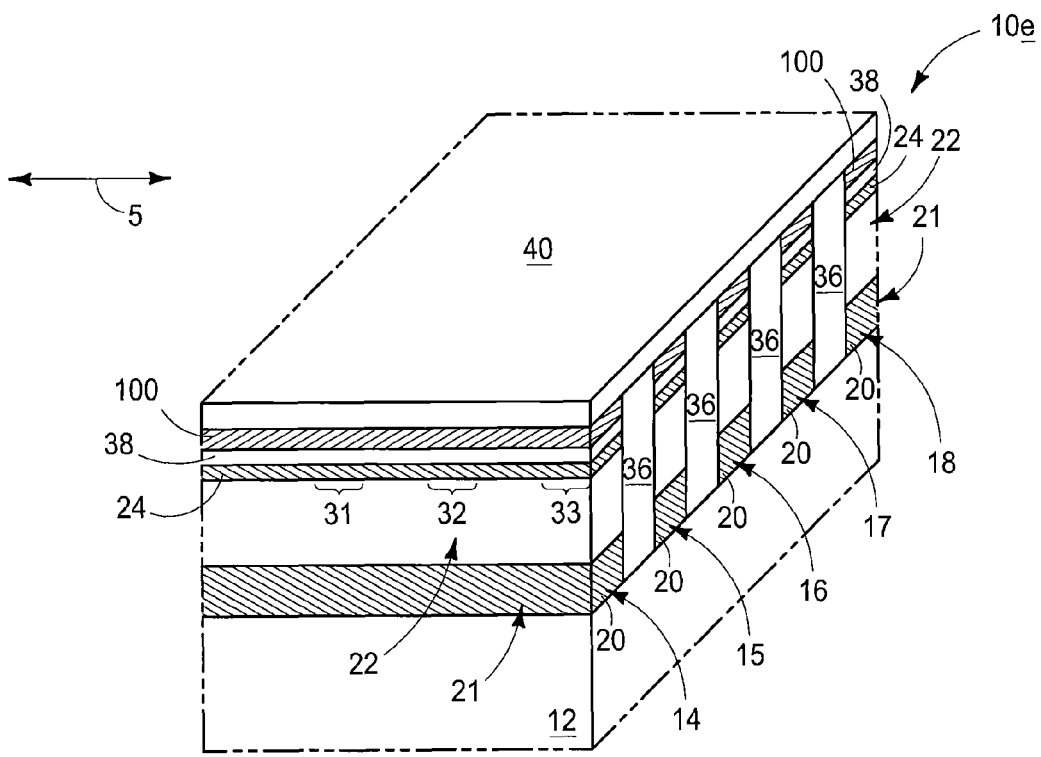
Figure 20:
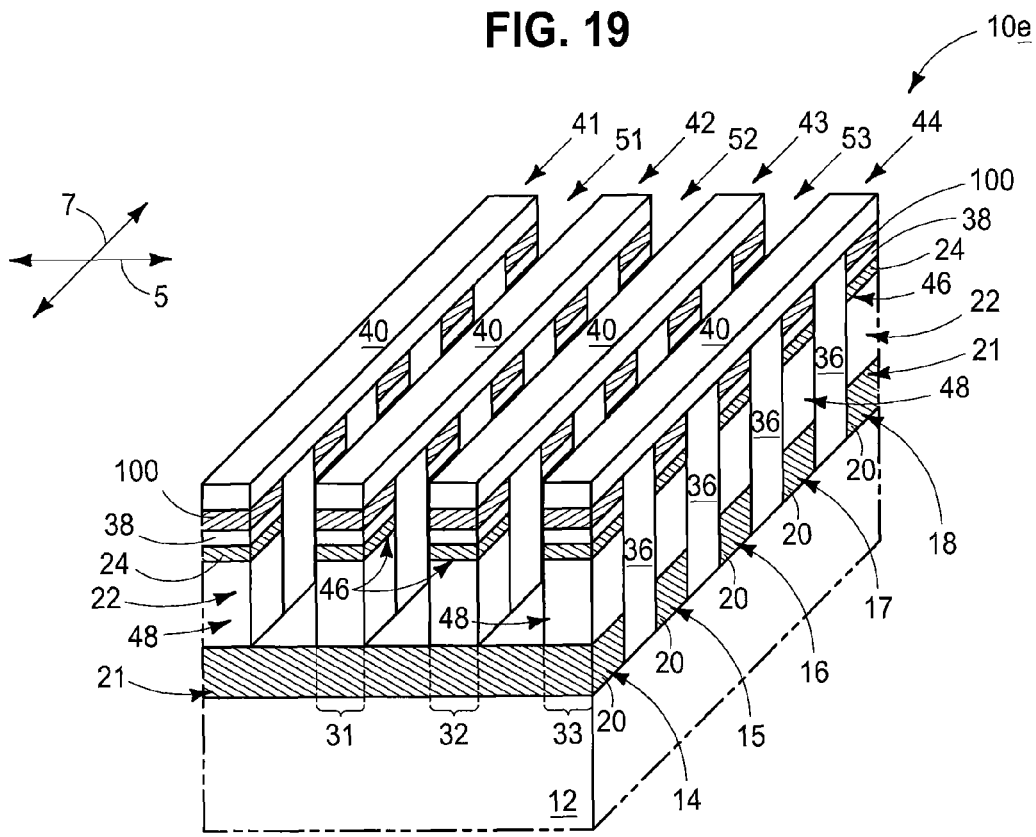
Figure 21:
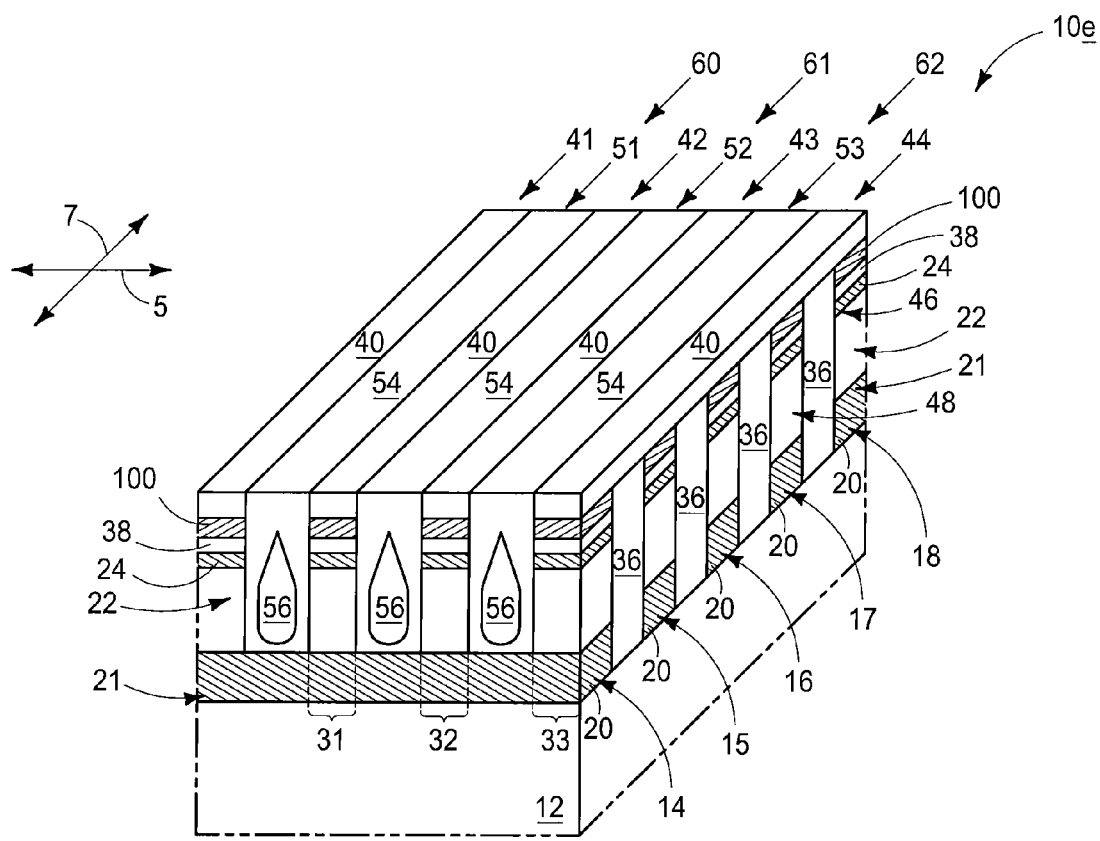
Figure 22:
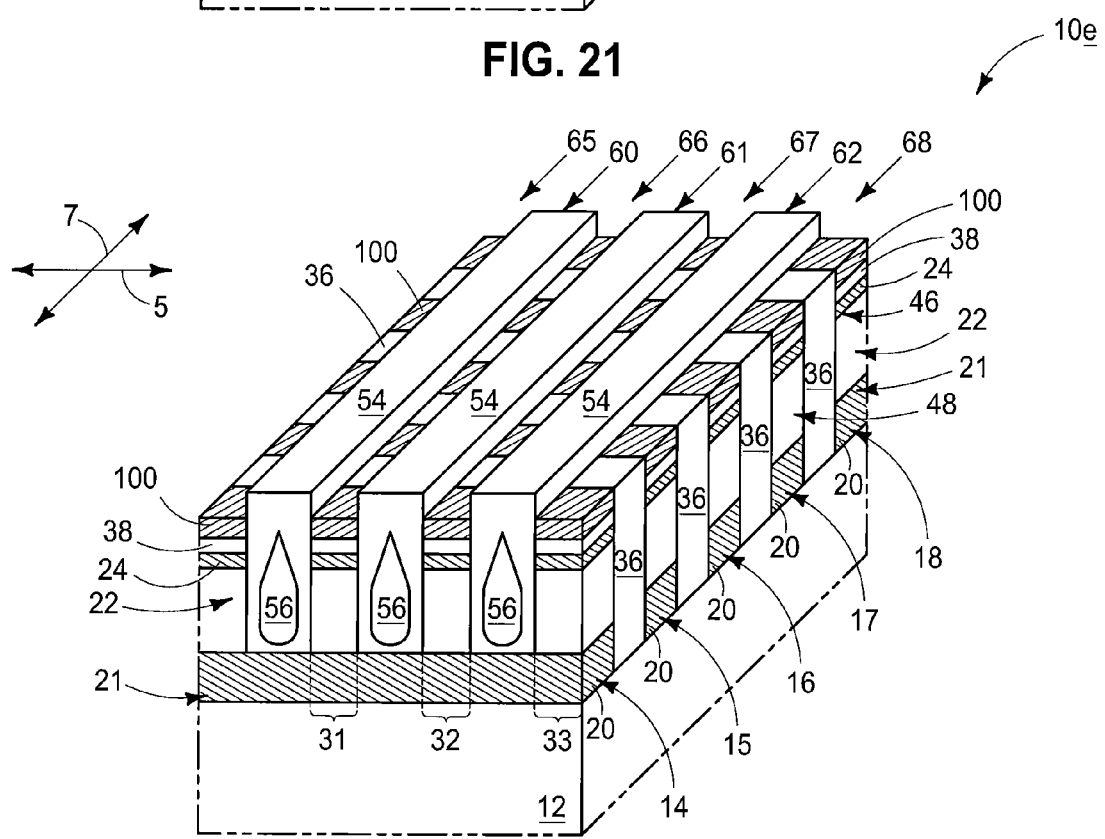

FIGS. 17-23 illustrate another example embodiment method of fabricating an array of memory cells. Referring to FIG. 17, a construction 10e is shown at a processing stage analogous to that of FIG. 1. However, unlike the construction of FIG. 1, the rails 14-18 include memory cell material 38 and an electrically conductive material 100. The material 100 may comprise any suitable composition or combination of compositions, and in some embodiments may comprise one or more of various metals (for instance, tungsten, platinum, silver, copper, etc.), metal-containing compositions (for instance, metal silicide, metal carbide, etc.) and conductively-doped semiconductor materials (for instance, conductively-doped silicon, conductively-doped germanium, etc.). Although only one memory cell material is shown, in other embodiments multiple memory cells may be provided between conductive materials 24 and 100.

Figure 23:
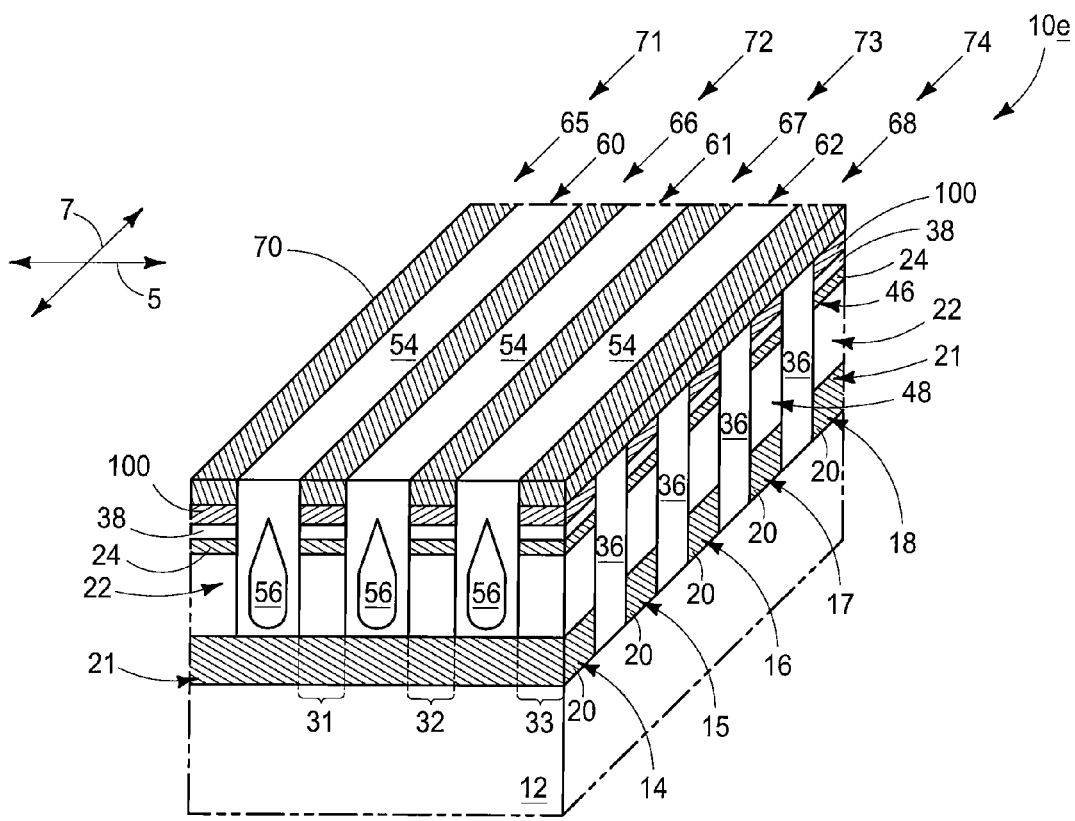

FIGS. 18-23 show the construction 10e processed with methodology analogous to that discussed above with reference to FIGS. 2-7 to form an array of memory cells (with such array comprising the illustrated memory cells 31-33 in FIG. 23). The memory cell material 38 of FIGS. 17-23 is singulated during the singulation of conductive material 24. Accordingly, each of the memory cells in the memory array of FIG. 23 (for instance, the memory cells 31-33) comprises a segment of material 38, with each segment of material 38 being associated with only a single memory cell location. In contrast, the memory cell material 38 within the memory array of FIG. 7 is shown to be patterned into expanses which extended across multiple memory cells. In the shown embodiment of FIGS. 17-23, the conductive material 100 is patterned together with the memory cell material 38 to form segments of material 100 in one-to-one correspondence with the memory cells (for instance, the memory cells 31-33).

Figure 24:
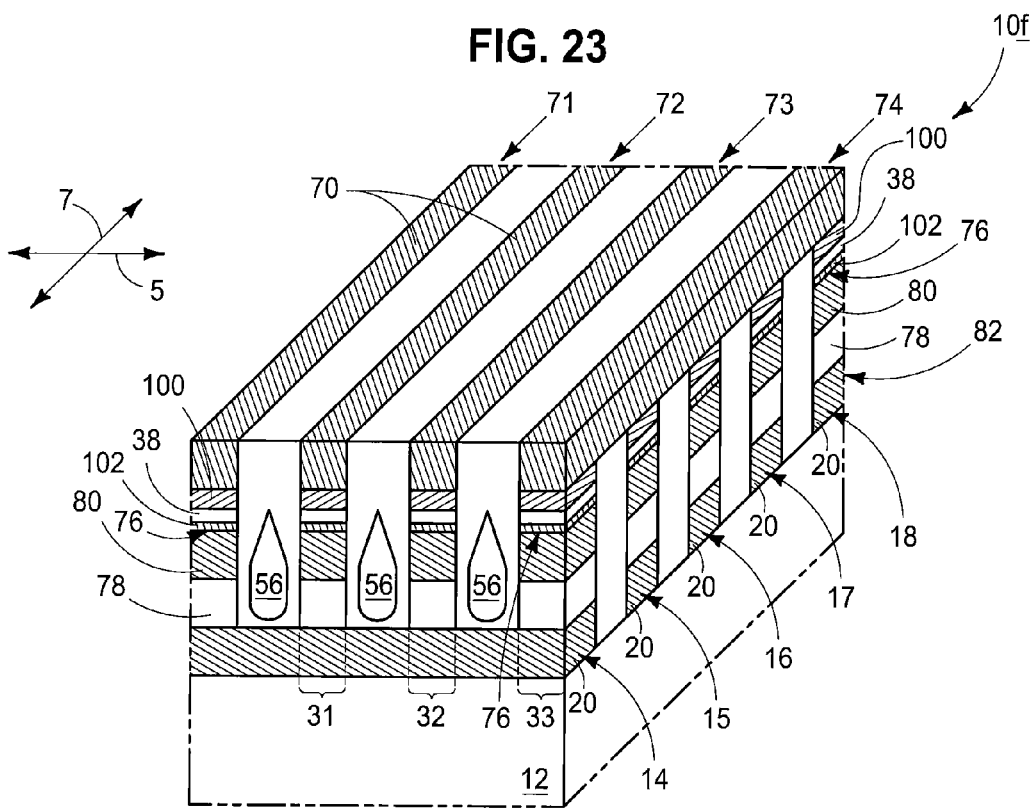
FIG. 24 is a diagrammatic three-dimensional view of a portion of a construction shown at a process stage of another example embodiment method of fabricating memory cells.

The materials of region 22 (FIGS. 17-23) may correspond to materials suitable for forming select devices. Example select devices are transistors (for instance, vertical transistors) and diodes. FIG. 24 illustrates an example embodiment in which region 22 comprises materials suitable for fabrication into diodes. Specifically, FIG. 24 shows a construction 10f at a processing stage analogous to that of FIG. 12, with construction 10f comprising the singulated memory cell material 38 and conductive material 100 discussed above with reference to FIGS. 17-23. The regions 20, 78 and 80 may be regions of a diode (for instance, region 20 may be an n-type doped region, region 78 may be an intrinsic region, and region 80 may be a p-type doped region, as discussed above with reference to FIGS. 8-12). In the shown embodiment, the memory cells 76 also comprise a conductive material 102 between the top diode region 80 and the memory cell material 38. Such conductive material may be utilized to improve adhesion between of material 38, improve electrical transfer to material 38 and/or to improve other properties of the memory cells. The conductive material 102 may comprise any suitable composition or combination of compositions and in some embodiments may comprise one or more of various metals (for instance, tungsten, platinum, silver, copper, etc.), metal-containing compositions (for instance, metal silicide, metal carbide, etc.) and conductively-doped semiconductor materials (for instance, conductively-doped silicon, conductively-doped germanium, etc.). The materials 100 and 102 are shown to have different thicknesses relative to one another, with material 100 being thicker than material 102. In other embodiments, materials 100 and 102 may be about the same thickness as one another, or material 102 may be thicker than material 100.

The memory cells and arrays discussed above may be incorporated into electronic systems. Such electronic systems may be any of a broad range of systems either now known or yet to be developed; with example electronic systems being clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a method of forming a plurality of memory cells. A series of rails is formed to extend along a first direction. Individual rails extend along multiple memory cell locations. The individual rails comprise bottom electrode contact material over electrically conductive lines. The electrically conductive lines are a first series of lines. An expanse of sacrificial material is formed to extend across the rails. The sacrificial material is patterned into a second series of lines that extends along a second direction that crosses the first direction. A pattern of the second series of lines is transferred into the bottom electrode contact material to singulate the bottom electrode contact material into segments associated with only single memory cell locations. At least a portion of the sacrificial material of the second series of lines is replaced with top electrode material.

Some embodiments include a method of forming a plurality of memory cells. A series of rails is formed to extend along a first direction. Individual rails extend along multiple memory cell locations. The individual rails comprise bottom electrode contact material stacked over electrically conductive lines. A series of sacrificial material lines is formed to extend along a second direction that crosses the first direction. The sacrificial material lines are directly over the memory cell locations. A pattern of the sacrificial material lines is transferred into the bottom electrode contact material to singulate the bottom electrode contact material into segments associated with only single memory cell locations. A series of dielectric lines is formed between the sacrificial material lines. The dielectric lines extend along the second direction. The sacrificial material lines are removed to leave trenches between the dielectric lines. The trenches are directly over the segments of the bottom electrode contact material. Top electrode material is formed within the trenches and over the dielectric material lines. The top electrode material is planarized to remove the top electrode material from over the dielectric material lines and thereby form a plurality of top electrode lines directly over the memory cell locations. The top electrode lines extend along the second direction.

Some embodiments include a method of forming a plurality of memory cells. A series of rails is formed to extend along a first direction. Individual rails extend along multiple memory cell locations. The individual rails comprise bottom electrode contact material stacked over electrically conductive lines. The electrically conductive lines are a first series of lines. An expanse of sacrificial material is formed to extend across the rails. The sacrificial material is patterned into a second series of lines which extend along a second direction that crosses the first direction. A pattern of the second series of lines is transferred into the bottom electrode contact material to singulate the bottom electrode contact material into segments associated with only single memory cell locations. The transferring of the pattern forms a series of first trenches that extend along the second direction. Individual trenches of the first series are between adjacent lines of the second series. One or more dielectric materials are formed within the first series of trenches. After said one or more dielectric materials are formed, the sacrificial material is removed to leave a second series of trenches that extend along the second direction. Individual trenches of the second series are directly over the segments of bottom electrode contact material. Top electrode material is formed within the second series of trenches and over the one or more dielectric materials. The top electrode material is planarized to remove the top electrode material from over the one or more dielectric materials and thereby form a plurality of top electrode lines that extend along the second direction.

Some embodiments include a memory array that comprises a first series of electrically conductive lines extending along a first direction. Pillars are over the first series of electrically conductive lines. The pillars are capped with bottom electrode contact material and are directly between the electrically conductive lines of the first series and memory cell locations. One or more memory cell materials are over the pillars and within the memory cell locations. A second series of electrically conductive lines extends along a second direction that crosses the first direction. The second series of electrically conductive lines comprises top electrode material. The memory cell locations are directly between the electrically conductive lines of the first and second series, and are in regions where the electrically conductive lines of the second series overlap the electrically conductive lines of the first series. The electrically conductive lines of the second series comprise one or more of platinum, copper and silver.

Some embodiments include a memory array that comprises a first series of electrically conductive lines extending along a first direction. Pillars are over the first series of electrically conductive lines. The pillars are capped with bottom electrode contact material and are directly between the electrically conductive lines of the first series and memory cell locations. A first memory cell material is over the pillars and within the memory cell locations. The first memory cell material is a planar sheet within the memory cell locations, and is directly against the bottom electrode contact material. A second memory cell material is over the first memory cell material. The second memory cell material is configured as a plurality of upwardly-opening containers that extend linearly along a second direction that crosses the first direction. A second series of electrically conductive lines is within the containers. The second series of electrically conductive lines comprises top electrode material. The memory cell locations are directly between the electrically conductive lines of the first and second series, and are in regions where the electrically conductive lines of the second series overlap the electrically conductive lines of the first series.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a plurality of memory cells, comprising:
    forming a series of rails extending along a first direction, individual rails extending along multiple memory cell locations, the individual rails comprising bottom electrode contact material over electrically conductive lines, the electrically conductive lines being a first series of lines;
    forming an expanse of sacrificial material extending across the rails;
    patterning the sacrificial material into a second series of lines extending along a second direction that crosses the first direction;
    transferring a pattern of the second series of lines into the bottom electrode contact material to singulate the bottom electrode contact material into segments associated with only single memory cell locations;
    replacing at least a portion of the sacrificial material of the second series of lines with top electrode material; and
    wherein a first memory cell material is formed within the memory cell locations prior to forming the expanse of sacrificial material, and wherein a second memory cell material is formed within the memory cell locations by replacing a portion of the sacrificial material of the second series of lines with the second memory cell material.

2. The method of claim 1 wherein the top electrode material comprises one or more noble metals.

3. The method of claim 1 wherein the top electrode material comprises one or more of platinum, copper and silver.

4. A method of forming a plurality of memory cells, comprising:
    forming a series of rails extending along a first direction, individual rails extending along multiple memory cell locations, the individual rails comprising bottom electrode contact material stacked over electrically conductive lines;

forming a series of sacrificial material lines extending along a second direction that crosses the first direction, the sacrificial material lines being directly over the memory cell locations and in physical contact with the bottom electrode contact material;

transferring a pattern of the sacrificial material lines into the bottom electrode contact material to singulate the bottom electrode contact material into segments associated with only single memory cell locations;

forming a series of dielectric lines between the sacrificial material lines, the dielectric lines extending along the second direction;

removing the sacrificial material lines to leave trenches between the dielectric lines, the trenches being directly over the segments of the bottom electrode contact material;

forming top electrode material within the trenches and over the dielectric material lines;

planarizing the top electrode material to remove the top electrode material from over the dielectric material lines and thereby form a plurality of top electrode lines directly over the memory cell locations and extending along the second direction;

forming memory cell material over the bottom electrode contact material within the memory cell locations prior to forming the top electrode material within the trenches; and wherein at least some of the memory cell material is formed within the trenches.

5. The method of claim 4 wherein the forming of the memory cell material within the trenches comprises forming planar sheets of the memory cell material along bottoms of the trenches.

6. The method of claim 4 wherein the forming of the memory cell material within the trenches comprises forming upwardly opening container-shaped structures of the memory cell material.

7. A method of forming a plurality of memory cells, comprising:

forming a series of rails extending along a first direction, individual rails extending along multiple memory cell locations, the individual rails comprising bottom electrode contact material stacked over electrically conductive lines, the electrically conductive lines of the individual rails being in direct physical contact with an underlying insulative material;

forming memory material over the series of rails;

after forming the memory material, forming a series of sacrificial material lines extending along a second direction that crosses the first direction, the sacrificial material lines being directly over the memory cell locations;

transferring a pattern of the sacrificial material lines into the bottom electrode contact material to singulate the bottom electrode contact material into segments associated with only single memory cell locations;

forming a series of dielectric lines between the sacrificial material lines, the dielectric lines extending along the second direction;

removing the sacrificial material lines to leave trenches between the dielectric lines, the trenches being directly over the segments of the bottom electrode contact material;

forming top electrode material within the trenches and over the dielectric material lines;

planarizing the top electrode material to remove the top electrode material from over the dielectric material lines and thereby form a plurality of top electrode lines directly over the memory cell locations and extending along the second direction; and wherein the segments of the bottom electrode contact material are along tops of select devices.

8. The method of claim 7 wherein the select devices are transistors.

9. The method of claim 7 wherein the select devices are diodes which are singulated during the singulation of the bottom electrode contact material.

10. A method of forming a plurality of memory cells, comprising:

forming a series of rails extending along a first direction, individual rails extending along multiple memory cell locations, the individual rails comprising bottom electrode contact material stacked over electrically conductive lines, the electrically conductive lines being a first series of lines;

forming an expanse of sacrificial material extending across the rails and in direct contact with an upper surface of the bottom electrode contact material;

patterning the sacrificial material into a second series of lines extending along a second direction that crosses the first direction;

transferring a pattern of the second series of lines into the bottom electrode contact material to singulate the bottom electrode contact material into segments associated with only single memory cell locations; the transferring of the pattern forming a first series of trenches that extends along the second direction; individual trenches of the first series being between adjacent lines of the second series;

forming one or more dielectric materials within the first series of trenches;

after forming said one or more dielectric materials, removing the sacrificial material to leave a second series of trenches that extends along the second direction; individual trenches of the second series being directly over the segments of bottom electrode contact material;

forming top electrode material within the second series of trenches and over the one or more dielectric materials;

planarizing the top electrode material to remove the top electrode material from over the one or more dielectric materials and thereby form a plurality of top electrode lines extending along the second direction; and forming memory cell material within the trenches of the second series prior to forming the top electrode material within such trenches.

11. The method of claim 10 wherein the memory cell material forms upwardly-opening containers within the trenches of the second series; and wherein the top electrode material is formed within said upwardly-opening containers.

12. A method of forming a plurality of memory cells, comprising:

forming a series of rails extending along a first direction, individual rails extending along multiple memory cell locations, the individual rails comprising bottom electrode contact material stacked over electrically conductive lines, the electrically conductive lines being a first series of lines;

forming an expanse of sacrificial material extending across the rails;

patterning the sacrificial material into a second series of lines extending along a second direction that crosses the first direction;

transferring a pattern of the second series of lines into the bottom electrode contact material to singulate the bottom electrode contact material into segments associated with only single memory cell locations; the transferring of the pattern forming a first series of trenches that extends along the second direction; individual trenches of the first series being between adjacent lines of the second series;

forming one or more dielectric materials within the first series of trenches;

after forming said one or more dielectric materials, removing the sacrificial material to leave a second series of trenches that extends along the second direction; individual trenches of the second series being directly over the segments of bottom electrode contact material;

forming top electrode material within the second series of trenches and over the one or more dielectric materials;

planarizing the top electrode material to remove the top electrode material from over the one or more dielectric materials and thereby form a plurality of top electrode lines extending along the second direction; and forming an expanse of memory cell material across the rails, and forming the expanse of sacrificial material over the expanse of memory cell material; and wherein the pattern of the second series of lines is transferred into the expanse of memory cell material.

13. The method of claim 12 wherein the memory cell material is a first memory cell material, and further comprising forming a second memory cell material within the trenches of the second series prior to forming the top electrode material within such trenches.

14. The method of claim 13 wherein the second memory cell material forms upwardly-opening containers within the trenches of the second series; and wherein the top electrode material is formed within said upwardly-opening containers.

* * * * *